United States Patent
Oohashi et al.

(10) Patent No.: US 6,940,701 B2
(45) Date of Patent: Sep. 6, 2005

(54) MAGNETIC SENSOR, PRODUCTION PROCESS OF THE MAGNETIC SENSOR AND MAGNETIC ARRAY SUITABLE FOR THE PRODUCTION PROCESS

(75) Inventors: Toshiyuki Oohashi, Hamamatsu (JP); Yukio Wakui, Iwata-gun (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 10/874,224

(22) Filed: Jun. 24, 2004

(65) Prior Publication Data

US 2004/0231135 A1 Nov. 25, 2004

Related U.S. Application Data

(62) Division of application No. 10/689,041, filed on Oct. 21, 2003.

(30) Foreign Application Priority Data

Oct. 23, 2002 (JP) ........................................ 2002-308376
Oct. 20, 2003 (JP) ........................................ 2003-359790

(51) Int. Cl.⁷ ............................................. G11B 5/127
(52) U.S. Cl. ............................ 360/324.12; 360/324.11; 29/603.08; 335/284
(58) Field of Search .................... 360/313, 324–324.12; 335/284; 29/603.01, 603.07, 603.08, 607

(56) References Cited

U.S. PATENT DOCUMENTS 6,721,145 B2 * 4/2004 Beach ................... 360/324.11
2004/0212360 A1 * 10/2004 Sato et al. ................. 324/200

FOREIGN PATENT DOCUMENTS

| JP | 2000-338211 | 12/2000 |
| JP | 2002-299728 | 10/2002 |
| JP | 2004-193540 | 7/2004 |

OTHER PUBLICATIONS

Copy of Honeywell catalog re Linear Magnetic Field Sensors.

* cited by examiner

*Primary Examiner*—Ramon M. Barrera
(74) *Attorney, Agent, or Firm*—Dickstein, Shapiro, Morin & Oshinsky, LLP.

(57) ABSTRACT

The present invention aims to provide a magnetic sensor provided with a magnetoresistive effect element capable of stably maintaining a direction of magnetization in a magnetic domain of a free layer.

The magnetic sensor includes a magnetoresistive effect element provided with narrow zonal portions $11a \ldots 11a$ including a pinned layer and a free layer. Disposed below both ends of the free layer are bias magnet films $11b \ldots 11b$ composed of a permanent magnet that applies to the free layer a bias magnetic field in a predetermined direction and an initializing coil 31 that is disposed in the vicinity of the free layer and applies to the free layer a magnetic field having the direction same as that of the bias magnetic field by being energized under a predetermined condition. Further, magnetizing the bias magnet films and fixing the direction of magnetization of the pinned layer are performed by a magnetic field formed by a magnet array configured such that plural permanent magnets are arranged on a lattice point of a tetragonal lattice and a polarity of a magnet pole of each permanent magnet is different from a polarity of the other adjacent magnet pole spaced by the shortest route.

3 Claims, 28 Drawing Sheets

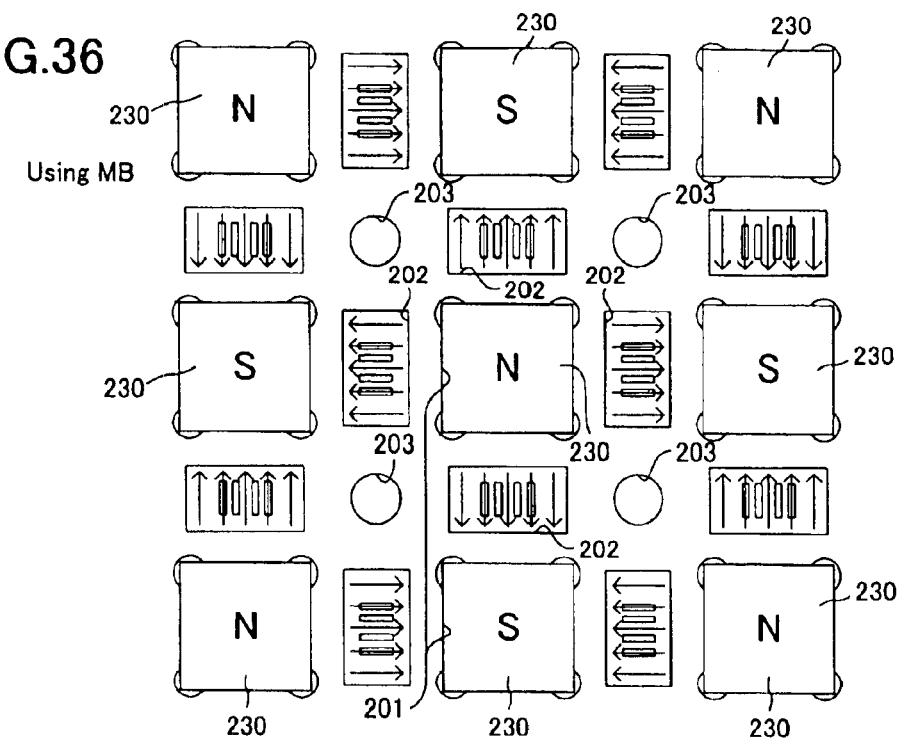
FIG.36 Using MB
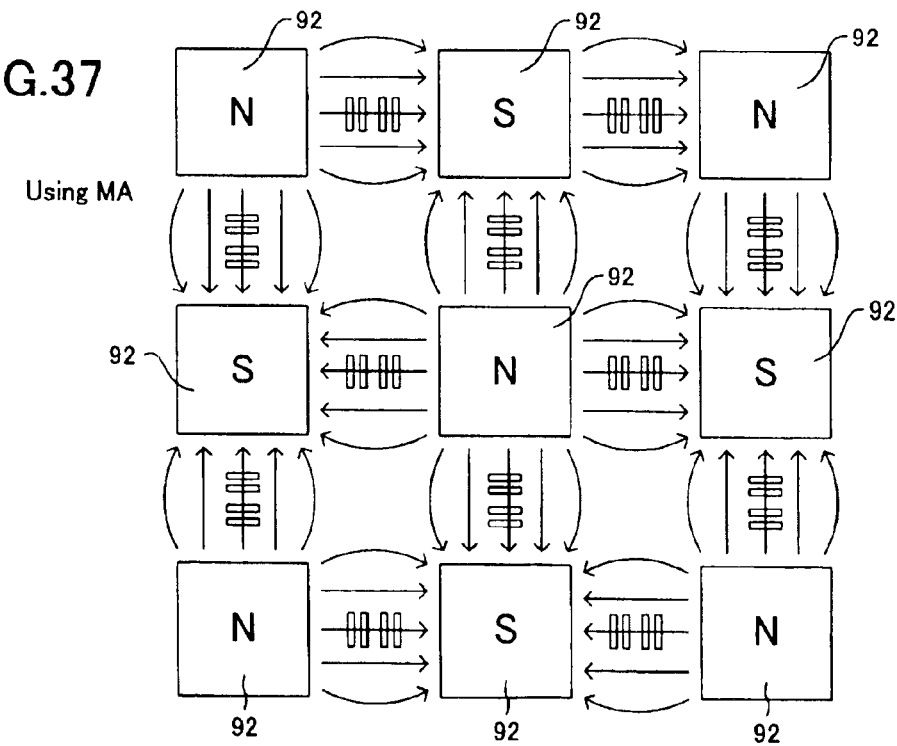
FIG.37 Using MA

MAGNETIC SENSOR, PRODUCTION PROCESS OF THE MAGNETIC SENSOR AND MAGNETIC ARRAY SUITABLE FOR THE PRODUCTION PROCESS

This is a divisional of U.S. patent application Ser. No. 10/689,041, filed Oct. 21, 2003, in the name of Toshiyuki OOHASHI and Yukio WAKUI, entitled MAGNETIC SENSOR, PRODUCTION PROCESS OF THE MAGNETIC SENSOR AND MAGNETIC ARRAY SUITABLE FOR THE PRODUCTION PROCESS.

BACKGROUND OF THE INVENTION

1. Field of the Invention

The present invention relates to a magnetic sensor using a magnetoresistive effect element including a pinned layer and a free layer, a production process of the magnetic sensor and a magnet array suitable for the production process.

2. Description of the Related Arts

Conventionally, a magnetoresistive effect element is applied to a magnetic sensor. For instance, the magnetoresistive effect element includes a giant magnetoresistive effect element (GMR element) or the like that is provided with a pinned layer having magnetization pinned (fixed) in a predetermined direction and a free layer in which the direction of magnetization is changed according to an external magnetic field and that presents a resistance value according to a relative relationship between the direction of magnetization in the pinned layer and the direction of magnetization in the free layer. In the magnetic sensor of this type, it is required that the direction of magnetization in each magnetic domain in the free layer in case where the external magnetic field is not applied to the magnetic sensor is stably maintained in a predetermined direction (this predetermined direction is referred to as "initial-state direction hereinafter) in order to accurately detect a minute external magnetic field.

In general, a thin free layer is shaped into a rectangle as viewed in a plane and the long side (long axis) of the rectangular is matched to the initial-state direction, whereby the direction in each domain in the free layer is matched to the initial-state direction by utilizing a shape anisotropy in which the direction of magnetization is aligned in the longitudinal direction. Further, a bias magnet film that is a permanent magnet film is disposed at both end sections of the longitudinal direction of the free layer to apply the magnetization in the initial-state direction to the free layer so that the direction of magnetization in each magnetic domain in the free layer is returned to the initial-state direction, with a long-term stability, whenever the external magnetic field disappears (see. Japanese Laid open publication 2002-299728 (FIGS. 42–44)).

The state of magnetization in the free layer and the bias magnet film as described above will be explained with reference to FIG. 17 that is a plan view of the free layer and the bias magnet film. In FIG. 17, a free layer 100 is formed to have a longitudinal direction in an X-axis direction, and a pair of bias magnet films 101 and 102 are arranged at both ends of the longitudinal direction.

At a stage of forming these films, the directions of magnetization in each magnetic domain of the free layer 100 and the bias magnet films 101 and 102 are not aligned to the initial-state direction that is the longitudinal direction of the free layer as shown by arrows in FIG. 17A. When an external magnetic field whose magnitude is changed in a direction (Y-axis direction) perpendicular to the longitudinal direction of the free layer is applied to the magnetic sensor in which the free layer 100 and the bias magnet films 101 and 102 are in above-mentioned state, for measuring a resistance value of the magnetic sensor, a hysteresis occurs as shown in FIG. 18A. As apparent from this, in the magnetic sensor wherein the directions of magnetization in the free layer 100 and the bias magnet films 101 and 102 are not aligned to the longitudinal direction of the free layer, the resistance value for the external magnetic field being in the vicinity of "0" fluctuates in a range shown by an arrow in FIG. 18A, resulting in that the magnetic sensor cannot accurately detect a minute magnetic field.

Subsequently, when a magnetic field having a magnitude greater than a coersive force Hc of the bias magnet films 101 and 102 is applied in the longitudinal direction (X-axis positive direction) to the magnetic sensor in which the free layer 100 and the bias magnet films 101 and 102 are in a state shown in FIG. 17A in order to perform an initialization of the free layer 100 and the magnetization of the bias magnet films 101 and 102, the directions of magnetization in each magnetic domain in the free layer 100 and the bias magnet films 101 and 102 are matched to the initial-state direction as shown in FIG. 17B.

When an external magnetic field whose magnitude is changed within a range smaller than the coersive force Hc of the bias magnet films 101 and 102 in the Y-axis direction is applied to the magnetic sensor which is in the above-mentioned state, the direction of magnetization in the magnetic domain in the free layer 100 is changed as shown in FIG. 17C, and then, after eliminating the external magnetic field, the direction of magnetization in each magnetic domain in the free layer 100 is returned to the initial-state direction as shown in FIG. 17D like that as shown in FIG. 17B. When the resistance value of the magnetic sensor is measured in this case, the hysteresis is decreased, so that the resistance value for the external magnetic field being in the vicinity of "0" becomes approximately constant. Accordingly, the magnetic sensor having the free layer 100 initialized and the bias magnet films 101 and 102 magnetized can accurately detect a minute magnetic field.

However, when an external magnetic field having a magnitude smaller than the coersive force of the magnet films 101 and 102 but relatively great and having a main component in the direction (X-axis negative direction) reverse to the initial-state direction is applied to the magnetic sensor (the magnetic sensor having the free layer 100 initialized and the bias magnet films 101 and 102 magnetized), the direction of magnetization in each magnetic domain in the free layer is changed from the state shown in FIG. 19A to the state shown in FIG. 19B, and even if the external magnetic field is eliminated, the direction of magnetization in each magnetic domain in the free layer 100 does not match (return) to the initial-state direction. As a result, the magnetic sensor has a hysteresis again with respect to the external magnetic field, entailing a problem of deteriorating the detection accuracy of the magnetic field.

SUMMARY OF THE INVENTION

Accordingly, one of objects of the present invention is to provide a magnetic sensor capable of satisfactorily maintaining a detection accuracy even after a great external magnetic field is applied thereto. Further, another object of the present invention is to provide a magnetic sensor capable of efficiently magnetizing the aforesaid bias magnet films, a production process of the magnetic sensor and a magnet array suitable for the production process.

According to the feature of the present invention, a magnetic sensor comprising a magnetoresistive effect element including a pinned layer and a free layer comprises a bias magnet film composed of a permanent magnet for producing a bias magnet field for (in) the free layer in a predetermined direction and an initializing coil that is provided in the vicinity of the free layer and applies to the free layer a magnetic field in the direction same as the direction of the bias magnetic field by being energized under a predetermined condition.

According to the above structure, the initializing coil is energized under a predetermined condition to thereby generate an initializing magnetic field for returning the direction of magnetization in each magnetic domain in the free layer to the direction same as the direction of the bias magnetic field by the bias magnet film, whereby the direction of magnetization in each magnetic domain in the free layer can be corrected even if the direction of magnetization is disturbed due to some reason such as when a strong magnetic field is applied to the magnetic sensor. As a result, a change in the resistance value to the magnetic field does not have hysteresis, whereby a magnetic sensor can be provided that can detect even a minute magnetic field with high precision over a long period.

Another feature of the present invention is that a production process of a magnetic sensor comprising, on a substrate, a pinned layer, a free layer and a bias magnet film being a permanent magnet that applies a bias magnetic field to the free layer to form a magnetoresistive effect element having a resistance value varying according to a relative angle made by a direction of magnetization in the pinned layer and a direction of magnetization in the free layer, comprises a step of preparing a magnet array configured such that plural permanent magnets are arranged on a lattice point of a tetragonal lattice and a polarity of a magnet pole of each permanent magnet is different from a polarity of the other adjacent magnet pole spaced by the shortest route (i.e., shortest distance), a step of manufacturing a wafer, including the substrate(s), on which plural island-like element films are interspersed, each element film including a film that becomes the pinned layer, a film that becomes the free layer and a film that becomes the bias magnet film and a step of disposing (placing, arranging) the wafer in the vicinity of the magnet array so as to establish a predetermined relative positional relationship between the wafer and the magnet array and magnetizing the film that becomes the bias magnet film of the plural element films by utilizing a magnetic field formed between one magnet pole of the magnet poles of the magnet array and other magnet pole, of the magnet poles of the magnet array, that is adjacent to the one magnet pole spaced by the shortest route (from the one magnet pole).

The magnet array is configured such that plural permanent magnets are arranged at a lattice point of a tetragonal lattice and the polarity of the magnetic pole of each permanent magnet is different from the polarity of the other adjacent magnetic pole spaced by the shortest route (in the same plane), as viewed in a plane. Accordingly, the following magnetic fields are formed above the magnet array as viewed in a plane of the magnet array: a magnetic filed formed from one N-pole in the rightward direction to S-pole that is present at the right side of the N-pole, a magnetic field formed from the N-pole in the upward direction to S-pole that is present at the upper side of the N-pole, a magnetic field formed from the N-pole in the leftward direction to S-pole that is present at the left side of the N-pole and a magnetic field formed from the N-pole in the downward direction to S-pole that is present at the lower side of the N-pole (see FIG. 13). Similarly, the following magnetic fields are formed to (toward) some S-pole: a magnetic field formed in the leftward direction from N-pole that is present at the right side of this S-pole, a magnetic field formed in the downward direction from N-pole that is present at the upper side of this S-pole, a magnetic field formed in the rightward direction from N-pole that is present at the left side of this S-pole and a magnetic field formed in the upward direction from N-pole that is present at the lower side of this S-pole.

In this process, a wafer, including the substrate(s), on which plural island-like element films is interspersed, each element film including a film that becomes the pinned layer, a film that becomes the free layer and a film that becomes the bias magnet film is disposed (placed, set, or arranged) in the vicinity of the magnet array so as to establish a predetermined relative positional relationship between the wafer and the magnet array and thereby the film that becomes the bias magnet film of the plural element films is magnetized by utilizing the above-mentioned magnetic field formed by the magnet array. Therefore, a magnetic sensor wherein magnetization directions of the bias magnet films are crossed (perpendicular in this case) to each other on a single substrate (a monolithic substrate) can efficiently be manufactured.

More specifically, the step of manufacturing the wafer includes a step of forming each film, that becomes the free layer, of the plural element films in such a manner as to have a shape with a long axis and a short axis, and in such a manner that at least one of the long axes of the films, that become the free layers, of the plural element films is perpendicular to the long axis of the other film, that becomes the free layer, of the plural element films, and a step of forming the film that becomes the bias magnet film at both ends of each film, that becomes the free layer, in the direction of the long axis, wherein the predetermined relative positional relationship in the step of magnetizing the film that becomes the bias magnet film is a relative relationship, between the wafer and the magnet array, that matches the direction of magnetization of the film that becomes the bias magnet film with the direction of the long axis of the film that becomes the free layer having the bias magnet film provided at both ends thereof, by a magnetic field formed by the magnet array.

Further, in this case, it is preferable to include a step of arranging the wafer in the vicinity of the magnet array so as to establish a relative positional relationship, between the wafer and the magnet array, that is different from the predetermined relative positional relationship, whereby the direction of magnetization of the film, that becomes the pinned layer, of the plural element films is pinned by utilizing the magnetic field formed by the magnet array.

According to this method, the magnet array used for magnetizing the film that becomes the bias magnet film is also used for fixing the direction of magnetization in the pinned layer, whereby a magnetic sensor (two-axis magnetic sensor that can detect the respective magnetic fields whose directions are perpendicular to each other) wherein magnetization directions of the bias magnet films are crossed (perpendicular in this case) to each other on a single substrate can efficiently be manufactured with low cost.

Moreover, the present invention provides a magnet array configured such that plural permanent magnets, each having an approximately rectangular parallelepiped shape in which the sectional shape perpendicular to one central axis of the rectangular parallelepiped is approximately square, are arranged such that the center of gravity of the edge face having approximately square shape is matched with a lattice point of the tetragonal lattice, and the polarity of the magnetic pole of each permanent magnet thus arranged is different from the polarity of the magnetic pole of the adjacent other permanent magnet spaced by the shortest route.

That is, this magnet array is the one where the plural permanent magnets are disposed such that the center of gravity of the edge face having approximately square shape is matched with a lattice point of the tetragonal lattice, a side of the edge face having said approximately square shape is on the same line on which a side of the other edge face disposed in the same row, the edge faces are in a single same plane, and the polarity of the magnetic pole of each permanent magnet thus arranged is different from the polarity of the magnetic pole of the adjacent other permanent magnet spaced by the shortest route.

As described above, magnetizing each film that becomes the bias magnet film and/or fixing the direction of magnetization in the layer that becomes the pinned layer of the above-mentioned two-axis magnetic sensor can efficiently be performed by using the magnet array, for example. Therefore, with the magnet array, it is possible to manufacture the two-axis magnetic sensor with low cost.

Further, this magnet array can be "A magnet array including plural permanent magnets, each having an approximately rectangular parallelepiped shape and having a sectional shape, perpendicular to one central axis of the rectangular parallelepiped, which is approximately square, and each having poles formed at both edge faces, one of which has the approximately square shape perpendicular to the central axis of the rectangular parallelepiped; wherein the plural permanent magnets are arranged in such a manner that each center of gravity of the edge faces having the approximately square shape is matched with a lattice point of a tetragonal lattice, a certain side of sides forming one of the edge faces of the plural permanent magnets disposed in a certain row of the tetragonal lattice and a certain side of sides forming one of the edge faces of the other plural permanent magnets disposed in the same row of the tetragonal lattice is in a same straight line, all the edge faces having the square shapes of the permanent magnets are placed in an approximately same single plane, and any two of the polarities of the magnetic poles of the permanent magnets disposed adjacent each other and spaced by the shortest route are different each other." and this array can preferably be used to magnetize the bias magnetic films and the like of the magnetic sensor mentioned above.

In addition, "A magnet array including plural permanent magnets, each having an approximately rectangular parallelepiped shape and having a sectional shape, perpendicular to one central axis of the rectangular parallelepiped, which is approximately square, and each having poles formed at both edge faces, one of which has the approximately square shape perpendicular to the central axis of the rectangular parallelepiped and a thin plate-like yoke formed of a magnetic material; wherein the plural permanent magnets are arranged in such a manner that each center of gravity of the edge faces having the approximately square shape is matched with a lattice point of a tetragonal lattice, a certain side of sides forming one of the edge faces of the plural permanent magnets disposed in a certain row of the tetragonal lattice and a certain side of sides forming one of the edge faces of the other plural permanent magnets disposed in the same row of the tetragonal lattice is in a same straight line, all the edge faces having the square shapes of the permanent magnets are placed in an approximately same single plane, and any two of the polarities of the magnetic poles of the permanent magnets disposed adjacent each other and spaced by the shortest route are different each other; and the yoke comprises plural through holes each of which has a shape which is the approximately same as the sectional shape which is approximately square and the holes being arranged at the positions where the permanent magnets are disposed, and the yoke being arranged in such a manner that the same single plane in which all the edge faces of the permanent magnets are placed is disposed between an upper surface and a lower surface of the yoke when the permanent magnets are inserted into the through holes." can preferably be used to magnetize the bias magnetic films and the like of the magnetic sensor mentioned above.

The magnet array has the yoke formed of the magnetic material, and therefore, it can lead magnetic flux lines from the permanent magnets to desirable portions. Accordingly, it is possible to magnetize the bias magnetic film of the magnetic sensor and the like efficiently by the magnet array.

In this case, it is preferable that the yoke have through openings serving as air gaps formed between the through holes that are adjacent each other and that are spaced by a shortest route.

Since this magnet array has through openings serving air gaps between the through holes that are adjacent each other and that are spaced by a shortest route (the edge faces having poles whose polarities are different from (opposite) each other are inserted into those two through holes), the magnetic flux concentrates both in the through openings and in a space close to the through openings. In other words, this magnet array can provide a narrow space local region with a magnetic field whose magnitude is great and whose direction is stably constant. Therefore, it is possible to magnetize the bias magnetic film of the magnetic sensor and the like efficiently by this magnet array.

It is also preferable that the yoke have openings at regions each of which is surrounding a center of gravity of a square drawn by lines connecting the lattice points of the tetragonal lattice in a plan view. This magnet array has not only above mentioned through openings but also the different openings.

The regions where the openings are formed is the region surrounding a center of gravity of a square drawn by lines connecting the lattice points of the tetragonal lattice. This regions is where magnetic flux lines stemming from the poles cross (or collide) to one another and thus the magnetic fields are unstable. Therefore, since the openings can eliminate instability of the magnetic field between poles having different polarities each other, the magnetic field can be made to be more linear, and thus, the magnetic field is provided which is more stable and whose magnitude is greater than the magnetic field for local regions in the neighborhood of the through openings. With this reason, it is possible to magnetize the bias magnetic film of the magnetic sensor and the like efficiently by this magnet array.

It is also preferable that each of the through holes of the yoke have a square portion having a square shape which is the approximately same as the shape of the sectional square shape of the permanent magnet in a plan view and a margin portions swelling outwardly from the square at each of corners of the square portion. When forming the through hole, in the yoke, having a square shape by etching, if the corner of the through hole is not completely etched, the permanent magnet may not be inserted into the through hole, since the corners of the thorough hole may become arc-like shapes. However, since the margin portions are etched in the magnet array mentioned above in forming the through holes by etching, the permanent magnet can be assuredly inserted into the through hole in the magnet array.

BRIEF DESCRIPTION OF THE DRAWINGS

The above and other objects, aspects, features and advantages of the present invention will become more apparent from the following detailed description when taken in conjunction with the accompanying drawings, in which:

FIGS. 17A, 17B, 17C and 17D are plan views each showing a state of magnetization of the free layer and the bias magnet films of the GMR element, wherein FIG. 17A is a view showing a state of the bias magnet films before they are magnetized, FIG. 17B is a view showing a state of the bias magnet films after they are magnetized, FIG. 17C is a view showing a state in which an external magnetic field is applied and FIG. 17D is a view showing a state after the external magnetic field is eliminated;

FIGS. 19A, 19B and 19C are plan views each showing a state of magnetization of the free layer and the bias magnet films of the GMR element, wherein FIG. 19A is a view showing a state of the bias magnet films before they are magnetized and that the external magnetic field is not applied, FIG. 19B is a view showing a state in which a strong external magnetic field is applied and FIG. 19C is a view showing a state after the strong external magnetic field is eliminated;

FIG. 36 is a conceptional plan view of the magnet array MB to explain a magnetic field by the magnet array MB;

FIG. 37 is a conceptional plan view of the magnet array MA to explain a magnetic field by the magnet array MA;

DESCRIPTION OF THE PREFERRED EMBODIMENT

Figure 1:
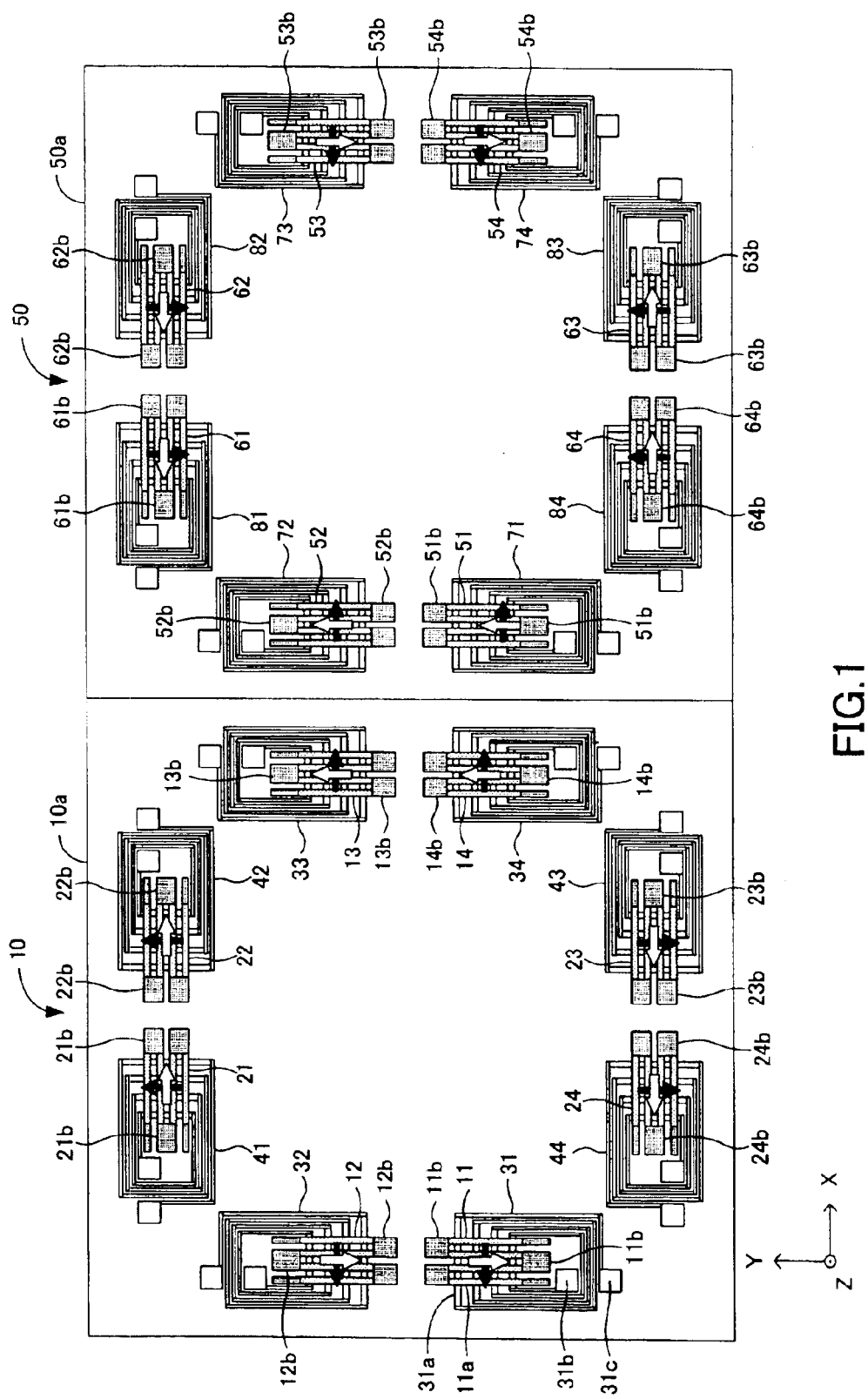
FIG. 1 is a plan view of a magnetic sensor in accordance with an embodiment of the present invention.

Embodiments of a magnetic sensor in accordance with the present invention will now be described with reference to the drawings. This magnetic sensor is classified into N-type and S-type depending upon a production process described later. FIG. 1 is a plan view wherein an N-type magnetic sensor 10 and an S-type magnetic sensor 50 are placed side by side. The N-type magnetic sensor 10 and the S-type magnetic sensor 50 have substantially the same shape and same configuration except that a direction of fixed magnetization in a pinned layer shown by black-solid arrows in FIG. 1 and a direction of magnetization in an initial state in a free layer shown by outline arrows in FIG. 1 are different from each other. Accordingly, the following explanation is mainly focused on the N-type magnetic sensor 10.

Figure 3:
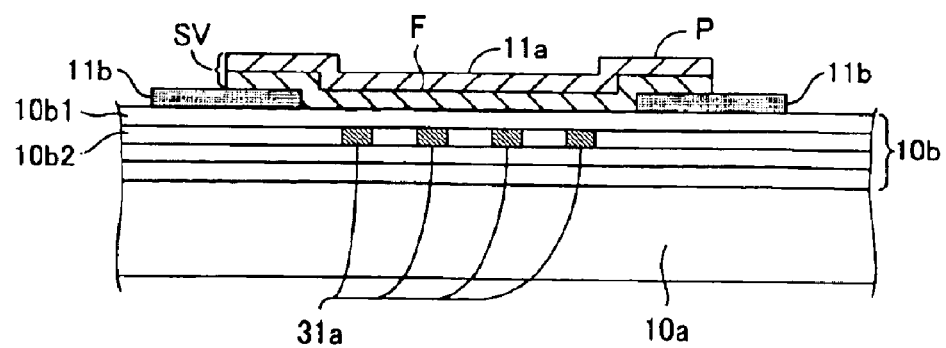
FIG. 3 is a schematic sectional view of the first X-axis GMR element shown in FIG. 2 cut by a plane along a line 1—1 in FIG. 2.

The magnetic sensor 10 comprises, as shown in FIG. 1, a single chip (a single substrate or a monolithic chip) 10a made of a quartz glass, which has a rectangular shape (almost square shape) viewed in a plane having sides along an X-axis direction and Y-axis direction perpendicular to each other, and has a little thickness in a Z-axis direction perpendicular to the X-axis and Y-axis, plural insulating layers 10b (wiring layers are included in this insulating layers) laminated on the substrate 10a shown in FIG. 3, a total of eight GMR elements 11 to 14, 21 to 24 formed on the uppermost layer 10b1 of the insulating layers 10b and a total of eight initializing coils (coils for initializing) 31 to 34 and 41 to 44.

The first X-axis GMR element 11 is formed at a portion a little downward from the almost central part in the Y-axis direction of the chip 10a and in the vicinity of an end portion of the X-axis negative direction. The direction of pinned magnetization of the pinned layer of the GMR element 11 is in the X-axis negative direction as shown by a black-solid arrow in FIG. 1. The second X-axis GMR element 12 is formed at a portion a little upward from the almost central part in the Y-axis direction of the chip 10a and in the vicinity of the end portion of the X-axis negative direction. The direction of pinned magnetization of the pinned layer of the GMR element 12 is in the X-axis negative direction shown by a black-solid arrow in FIG. 1. The third X-axis GMR element 13 is formed at a portion a little upward from the almost central part in the Y-axis direction of the chip 10a and in the vicinity of an end portion of the X-axis positive direction. The direction of pinned magnetization of the pinned layer of the GMR element 13 is in the X-axis positive direction as shown by a black-solid arrow in FIG. 1. The fourth X-axis GMR element 14 is formed at a portion a little downward from the almost central part in the Y-axis direction of the chip 10a and in the vicinity of the end portion of the X-axis positive direction. The direction of pinned magnetization of the pinned layer of the GMR element 14 is in the X-axis positive direction shown by a black-solid arrow in FIG. 1.

The first Y-axis GMR element 21 is formed at a portion a little leftward from the almost central part in the X-axis direction of the chip 10a and in the vicinity of an end portion of the Y-axis positive direction. The direction of pinned magnetization of the pinned layer of the GMR element 21 is in the Y-axis positive direction as shown by a black-solid arrow in FIG. 1. The second Y-axis GMR element 22 is formed at a portion a little rightward from the almost central part in the X-axis direction of the chip 10a and in the vicinity of the end portion of the Y-axis positive direction. The direction of pinned magnetization of the pinned layer of the GMR element 22 is in the Y-axis positive direction shown by a black-solid arrow in FIG. 1. The third Y-axis GMR element 23 is formed at a portion a little rightward from the almost central part in the X-axis direction of the chip 10a and in the vicinity of an end portion of the Y-axis negative direction. The direction of pinned magnetization of the pinned layer of the GMR element 23 is in the Y-axis negative direction as shown by a black-solid arrow in FIG. 1. The fourth Y-axis GMR element 24 is formed at a-portion a little leftward from the almost central part in the X-axis direction of the chip 10a and in the vicinity of the end portion of the Y-axis negative direction. The direction of pinned magnetization of the pinned layer of the GMR element 24 is in the Y-axis negative direction shown by a black-solid arrow in FIG. 1.

Each of the GMR elements 11 to 14 and 21 to 24 has substantially the same structure except for the position on the chip 10a. Therefore, the first X-axis GMR element 11 is taken as a representative example hereinbelow for explaining the structure thereof.

Figure 2:
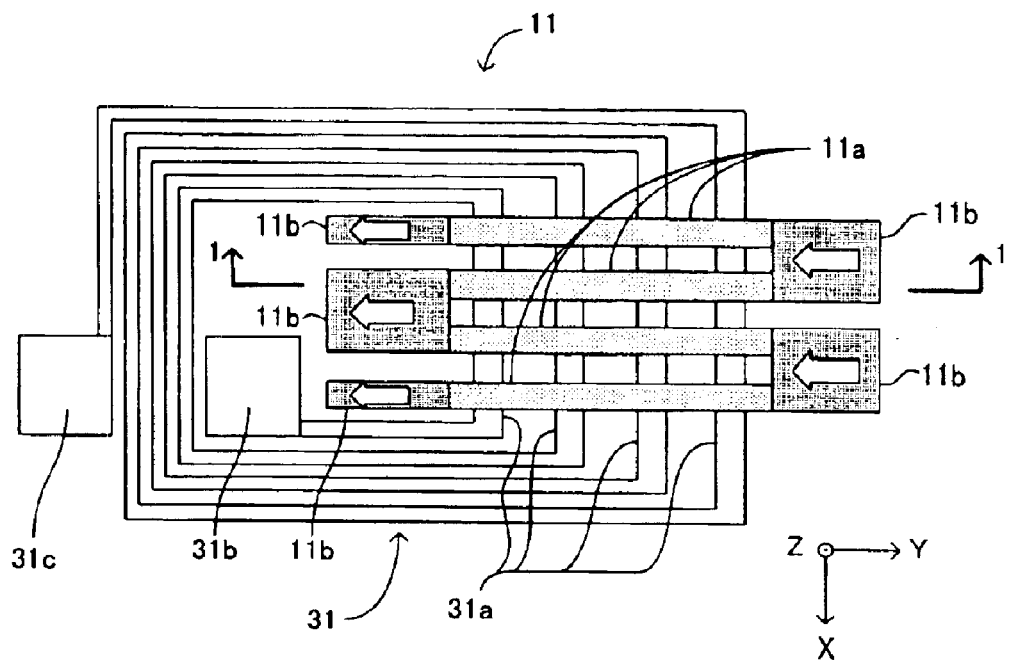
FIG. 2 is a schematic enlarged plan view of a first X-axis GMR element shown in FIG. 1.

The first X-axis GMR element 11 comprises, as shown in FIG. 2 that is a plan view and FIG. 3 that is a schematic sectional view of the first X-axis GMR element 11 cut by a plane along a line of 1—1 in FIG. 2, a plurality of narrow zonal portions 11a . . . 11a made of a spin valve film SV and having a longitudinal direction in the Y-axis direction and bias magnet films (hard ferromagnetic thin film layer and become a permanent magnet film by magnetization) 11b . . . 11b that are made of hard ferromagnetic materials, having high coercive force and high squareness ratio, such as CoCrPt. Each of the narrow zonal portions 11a . . . 11a extends in the X-axis direction on the upper surface of each of the bias magnet films 11b . . . 11b, and joins to the adjacent narrow zonal portion 11a to thereby form a so-called "zig-zag shape" as well as to thereby magnetically join to each of the bias magnet films 11b . . . 11b at the upper surface of each of the bias magnet films 11b . . . 11b.

Figure 4:
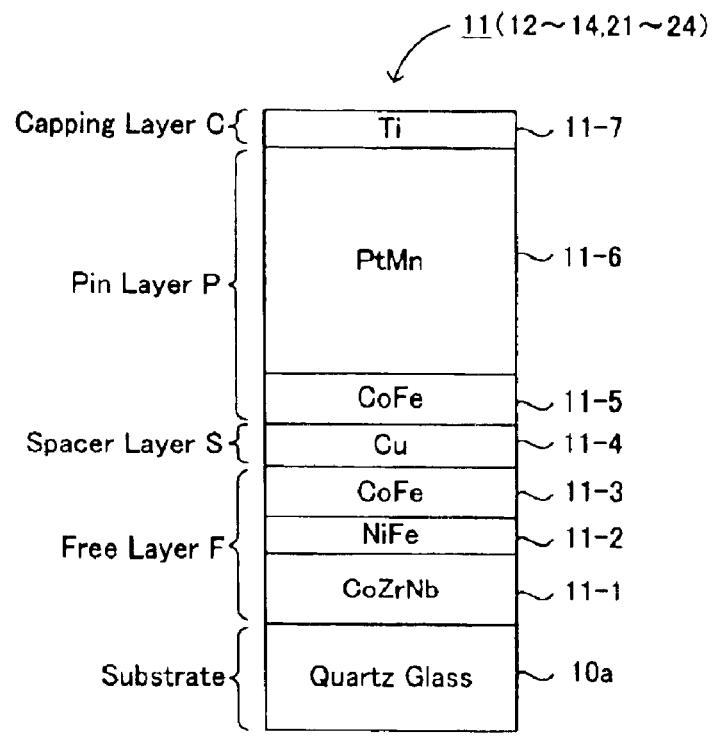
FIG. 4 is a view showing a structure of a spin valve film of the first X-axis GMR element shown in FIG. 2.

As shown in FIG. 4 that illustrates the film structure, the spin valve film SV of the first X-axis GMR element 11 includes a free layer F, a conductive spacer layer S made of Cu having a thickness of 2.4 nm (24 A), a fixed layer (pin layer) P and a capping layer C made of titanium (Ti) or tantalum (Ta) having a thickness of 2.5 nm (25 A), which are laminated in this order on the chip 10a serving as a substrate.

The free layer F is a layer whose magnetization direction varies in accordance with the direction of the external magnetic field, and comprises a CoZrNb amorphous magnetic layer 11-1 formed directly on the substrate 10a and having a film thickness of 8 nm (80 A), a NiFe magnetic layer 11-2 formed on the CoZrNb amorphous magnetic layer 11-1 and having a film thickness of 3.3 nm (33 A), and a CoFe layer 11-3 formed on the NiFe magnetic layer 11-2 and having a film thickness of approximately 1 to 3 nm (10 to 30

A). The CoZrNb amorphous magnetic layer 11-1 and NiFe magnetic layer 11-2 constitute a soft ferromagnetic material thin film layer. The CoFe layer 11-3 prevents Ni of the NiFe magnetic layer 11-2 and Cu 11-4 of the spacer layer S from diffusing.

The fixed layer (pin layer) P is made by superposing a CoFe magnetic layer 11-5 having a film thickness of 2.2 nm (22 A), and an antiferromagnetic film 11-6 which is formed of a PtMn alloy including 45 to 55 mol % of Pt and has a film thickness of 24 nm (240 A). The CoFe magnetic layer 11-5 is in an exchange coupling manner to the magnetized antiferromagnetic film 11-6. Thus, the direction of magnetization (magnetizing vector) of the CoFe magnetic layer 11-5 is pinned (fixed) in the X-axis negative direction as described above.

The bias magnet films 11b . . . 11b gives a bias magnetic field to the free layer F in the Y-axis negative direction (the direction shown by the outline arrow in FIGS. 1 and 2) that is the longitudinal direction of the free layer F in order to maintain uniaxial anisotropy of the free layer F.

Figure 5:
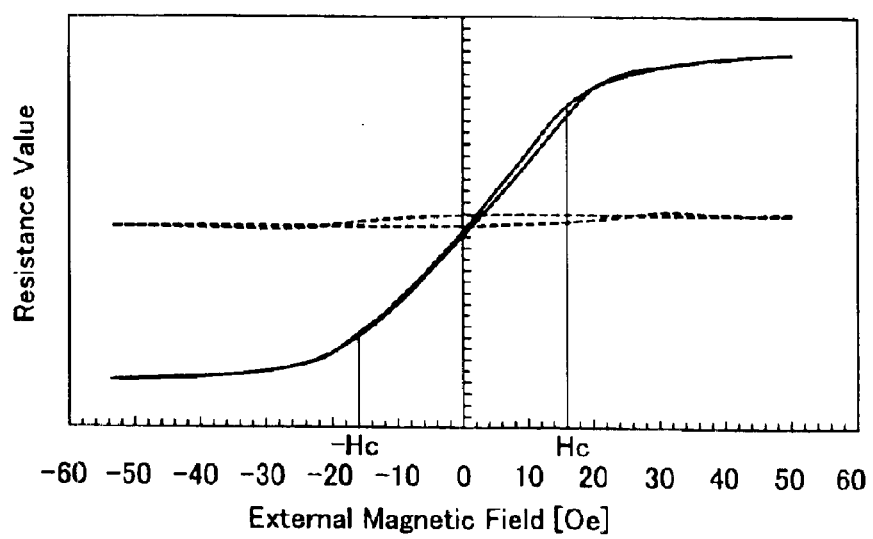
FIG. 5 is a graph showing by a solid line a resistance change of the first X-axis GMR element shown in FIG. 1 for a magnetic field changed in the X-axis direction and showing by a broken line a resistance change thereof for a magnetic field changed in the Y-axis direction.

The first X-axis GMR element 11 thus configured presents a resistance value, which changes in almost proportion to the external magnetic field that changes along the X-axis within a range of −Hc to +Hc, as indicated by the solid line of FIG. 5, and presents an almost constant resistance value to the external magnetic field that changes along the Y-axis, as indicated by the broken line of FIG. 5.

Subsequently, the initializing coils 31 to 34 and 41 to 44 are explained. The initializing coils 31 to 34 and 41 to 44 are buried in the lower insulating layer 10b2 under the uppermost layer 10b1 of the insulating layers. The initializing coils 31 to 34 and 41 to 44 are positioned approximately immediately below each of the GMR elements 11 to 14 and 21 to 24, respectively. Each of the initializing coils 31 to 34 and 41 to 44 has the same shape to one another, and its relative positional relationship to the corresponding GMR element immediately above each coil is the same to one another. Each of the initializing coils 31 to 34 and 41 to 44 applies the initializing magnetic field in the direction shown by the outline arrow in FIG. 1 to each corresponding GMR element.

The following explanation is made by taking the initializing coil 31 as a representative example. This initializing coil 31 is wound so as to have an approximately rectangular outer shape viewed in a plane, and comprises plural initializing magnetic field generating sections 31a . . . 31a extending linearly in the direction (X-axis direction) perpendicular to the longitudinal direction of the narrow zonal portions 11a of the first X-axis GMR element 11 at a region immediately below the first X-axis GMR element 11 viewed in a plane. Further, one end 31b and the other end 31c of the initializing coil 31 are connected to a positive polarity and negative polarity of a constant voltage source respectively. When a predetermined condition is established, predetermined current is made to flow through the initializing coil 31, thereby applying the initializing magnetic field in the Y-axis negative direction to the narrow zonal portion 11a of the first X-axis GMR element 11 as shown by the outline arrow in FIG. 1.

Figure 6A:
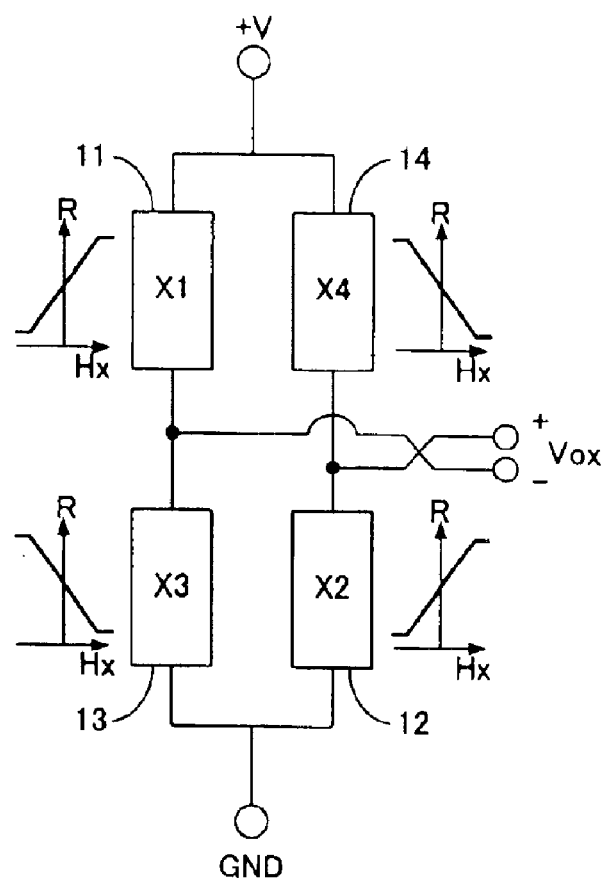
FIG. 6A is an equivalent circuit diagram of an X-axis magnetic sensor included in the magnetic sensor shown in FIG. 1.

Subsequently explained are an X-axis magnetic sensor (a magnetic sensor with a magnetic field detecting direction which is the X-axis direction) and a Y-axis magnetic sensor (a magnetic sensor with a magnetic field detecting direction which is the Y-axis direction) composed respectively of the GMR elements 11 to 14 and 21 to 24. As shown by an equivalent circuit in FIG. 6A, the X-axis magnetic sensor is formed such that the first to fourth X-axis GMR elements 11 to 14 are full-bridge-connected via a conductor not shown in FIG. 1. In FIG. 6A, each graph shown at the position adjacent to each of the first to fourth GMR elements 11 to 14 indicates a characteristic (change in the resistance value R with respect to the external magnetic field) of the GMR element adjacent to each graph. This is also true in FIGS. 7 to 9. Symbols Hx and Hy in these graphs respectively indicate the external magnetic field whose magnitude varies along the X-axis and Y-axis.

Figure 6B:
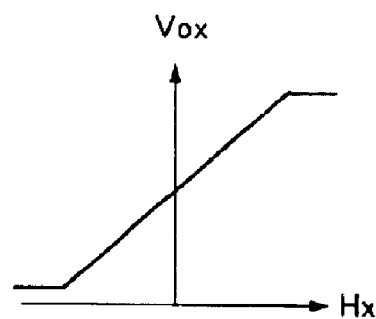
FIG. 6B is a graph showing a change of output for the magnetic field changed in the X-axis direction of the X-axis magnetic sensor.

In this configuration, a connection point between the first X-axis GMR element 11 and the fourth X-axis GMR element 14 and a connection point between the second X-axis GMR element 12 and the third X-axis GMR element 13 are respectively connected to the positive polarity and the negative polarity (ground) of the constant voltage source, whereby a potential of +V (5 (V) in this embodiment) and a potential −V (0 (V) in this embodiment) are respectively applied thereto. Then, a difference in potential $V_{Ox}$ between a connection point of the first X-axis GMR element 11 and the third X-axis GMR element 13 and a connection point of the fourth X-axis GMR element 14 and the second X-axis GMR element 12 are taken out as a sensor output. As a result, the X-axis magnetic sensor outputs, as shown in FIG. 6B, an output voltage $V_{Ox}$ that varies in approximately proportion to the external magnetic field Hx that changes along the X-axis.

Figure 7A:
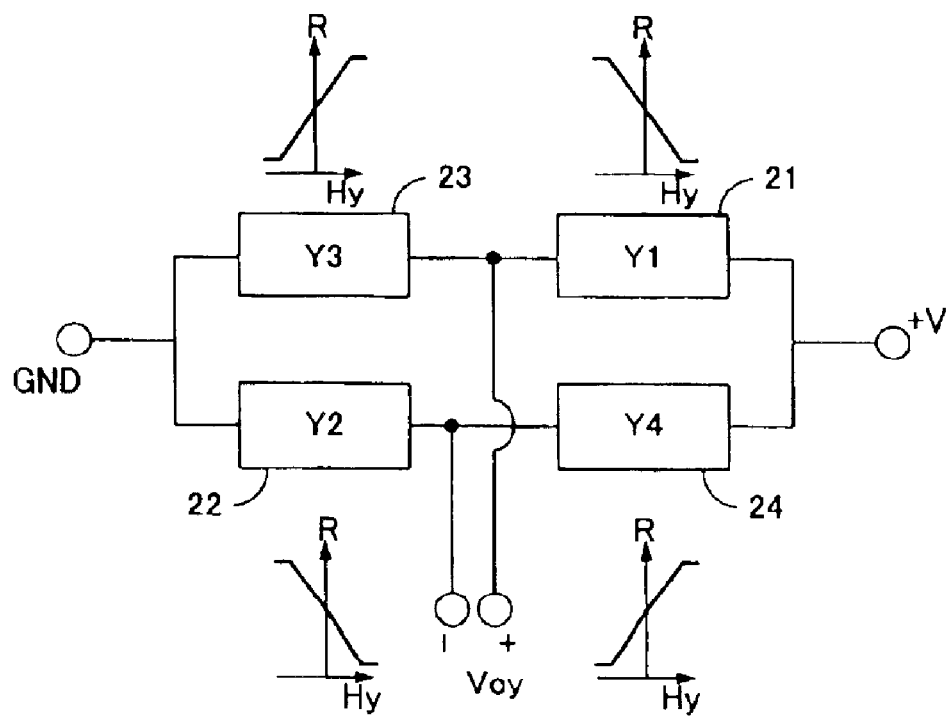
FIG. 7A is an equivalent circuit diagram of a Y-axis magnetic sensor included in the magnetic sensor shown in FIG. 1.
Figure 7B:
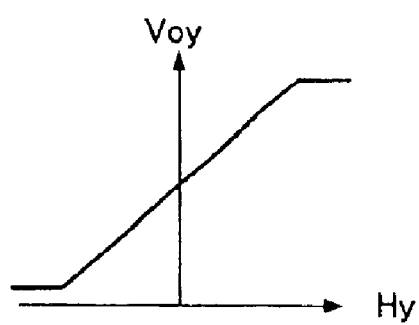
FIG. 7B is a graph showing a change of output for the magnetic field changed in the Y-axis direction of the Y-axis magnetic sensor.

As shown by an equivalent circuit in FIG. 7A, the Y-axis magnetic sensor is formed such that the first to fourth Y-axis GMR elements 21 to 24 are full-bridge-connected via a conductor not shown in FIG. 1. A connection point between the first Y-axis GMR element 21 and the fourth Y-axis GMR element 24 and a connection point between the second Y-axis GMR element 22 and the third Y-axis GMR element 23 are respectively connected to the positive polarity and the negative polarity (ground) of the constant voltage source, whereby a potential of +V (5 (V) in this embodiment) and a potential of −V (0 (V) in this embodiment) are respectively applied thereto. Then, a difference in potential $V_{Oy}$ between a connection point of the first Y-axis GMR element 21 and the third Y-axis GMR element 23 and a connection point of the fourth Y-axis GMR element 24 and the second Y-axis GMR element 22 are taken out as a sensor output. As a result, the Y-axis magnetic sensor outputs, as shown in FIG. 7B, an output voltage $V_{Oy}$ that varies in approximately proportion to the external magnetic field Hy that changes along the Y-axis. The above description is about the configuration of the N-type magnetic sensor 10.

On the other hand, the S-type magnetic sensor 50 includes GMR elements 51 to 54 and 61 to 64 and initializing coils 71 to 74 and 81 to 84 as shown in FIG. 1. The S-type magnetic sensor 50 has the substantially same structure as that of the magnetic sensor 10 and includes the X-axis magnetic sensor and Y-axis magnetic sensor.

Figure 8A:
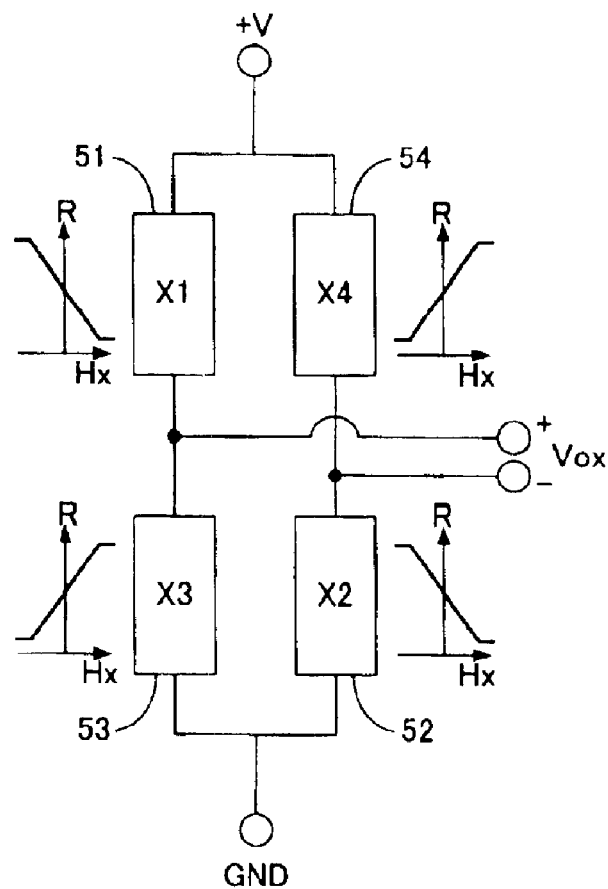
FIG. 8A is another equivalent circuit diagram of an X-axis magnetic sensor included in the magnetic sensor shown in FIG. 1.
Figure 8B:
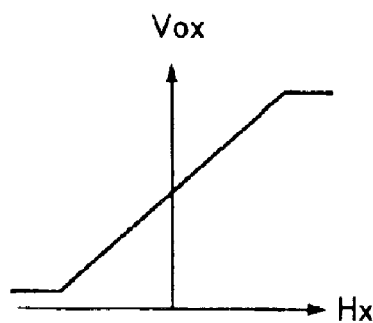
FIG. 8B is a graph showing a change of output for the magnetic field changed in the X-axis direction of the X-axis magnetic sensor.

Specifically, as shown by an equivalent circuit in FIG. 8A, the X-axis magnetic sensor is formed such that the first to fourth X-axis GMR elements 51 to 54 are full-bridge-connected via a conductor not shown in FIG. 1. In this configuration, a connection point between the first X-axis GMR element 51 and the fourth X-axis GMR element 54 and a connection point between the second X-axis GMR element 52 and the third X-axis GMR element 53 are respectively connected to the positive polarity and the negative polarity (ground) of the constant voltage source, whereby a potential of +V (5 (V) in this embodiment) and a potential of −V (0 (V) in this embodiment) are respectively applied thereto. Then, a difference in potential $V_{Ox}$ between a connection point of the first X-axis GMR element 51 and the third X-axis GMR element 53 and a connection point of the fourth X-axis GMR element 54 and the second X-axis GMR element 52 are taken out as a sensor output. As a result, the X-axis magnetic sensor outputs, as shown in FIG. 8B, an output voltage $V_{0x}$ that varies in approximately proportion to the external magnetic field Hx that changes along the X-axis.

Figure 9A:
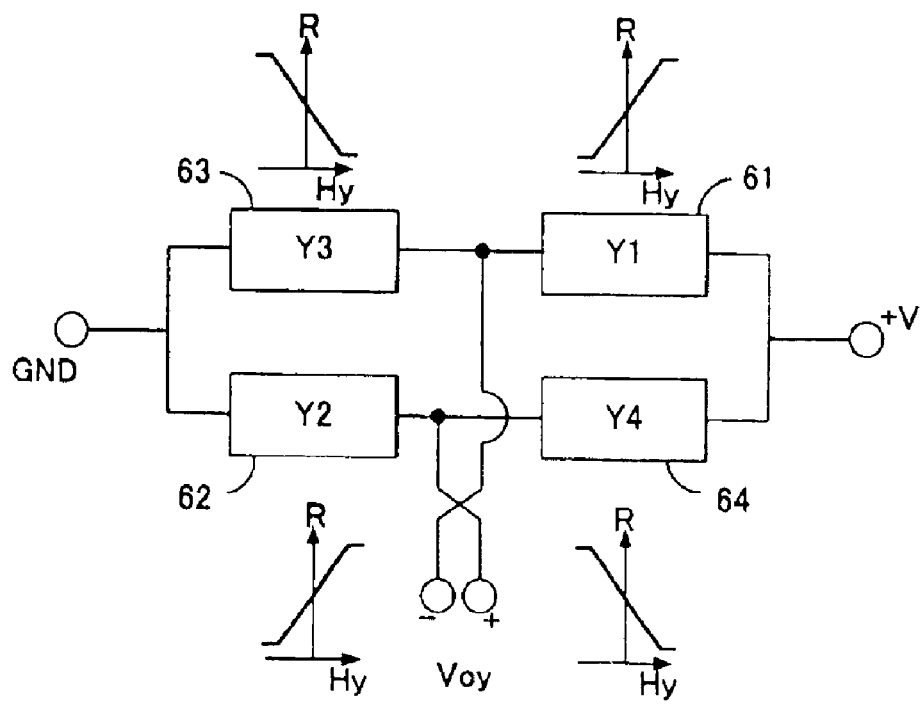
FIG. 9A is another equivalent circuit diagram of a Y-axis magnetic sensor included in the magnetic sensor shown in FIG. 1.
Figure 9B:
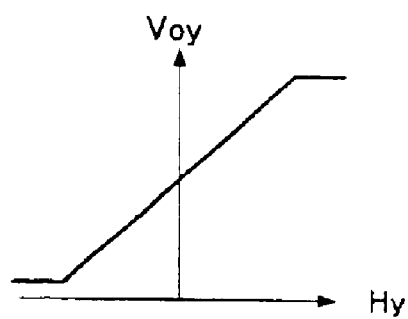
FIG. 9B is a graph showing a change of output for the magnetic field changed in the Y-axis direction of the Y-axis magnetic sensor.

Further, as shown by an equivalent circuit in FIG. 9A, the Y-axis magnetic sensor of the magnetic sensor 50 is formed such that the first to fourth Y-axis GMR elements 61 to 64 are full-bridge-connected via a conductor not shown in FIG. 1. A connection point between the first Y-axis GMR element 61 and the fourth Y-axis GMR element 64 and a connection point between the second Y-axis GMR element 62 and the third Y-axis GMR element 63 are respectively connected to the positive polarity and the negative polarity (ground) of the constant voltage source, whereby a potential of +V (5 (V) in this embodiment) and a potential −V (0 (V) in this embodiment) are respectively applied thereto. Then, a difference in potential $V_{0y}$ between a connection point of the first Y-axis GMR element 61 and the third Y-axis GMR element 63 and a connection point of the fourth Y-axis GMR element 64 and the second Y-axis GMR element 62 are taken out as a sensor output. As a result, the Y-axis magnetic sensor outputs, as shown in FIG. 9B, an output voltage $V_{0y}$ that varies in approximately proportion to the external magnetic field Hy that changes along the Y-axis.

Subsequently explained is a process for manufacturing the magnetic sensors 10 and 50 thus configured as described above. Firstly, each insulating layer 10b is laminated on a rectangular quartz glass (wafer) 10a1, that becomes the substrates 10a and 50a later, with the formation of a pre-determined wiring or LSI, followed by forming the initializing coils 31 to 34, 41 to 44, 71 to 74 and 81 to 84 in the insulating layer 10b2, and then, the uppermost insulating layer 10b1 is formed (see FIGS. 1 to 3).

Then, plural films M composing the GMR elements 11 to 14, 21 to 24, 51 to 54 and 61 to 64 are formed like an island. Specifically, said bias films 11b are formed and said films M which will become GMR elements 11 to 14, 21 to 24, 51 to 54 and 61 to 64 are formed on the bias film 11b. This film formation is performed by using a ultra-high vacuum device in a manner of continuous laminating with a precise thickness. The films M are patterned and thereby plural island-like portions which will become the GMR elements are formed. These films M are formed to be arranged at each position of the GMR elements 11 to 14, 21 to 24, 51 to 54 and 61 to 64 shown in FIG. 1 when the quarts glass 10a1 is cut along the broken line in FIG. 10 by a subsequent cutting process to thereby be divided into the individual magnetic sensor 10 and 50 shown in FIG. 1.

Figure 11:
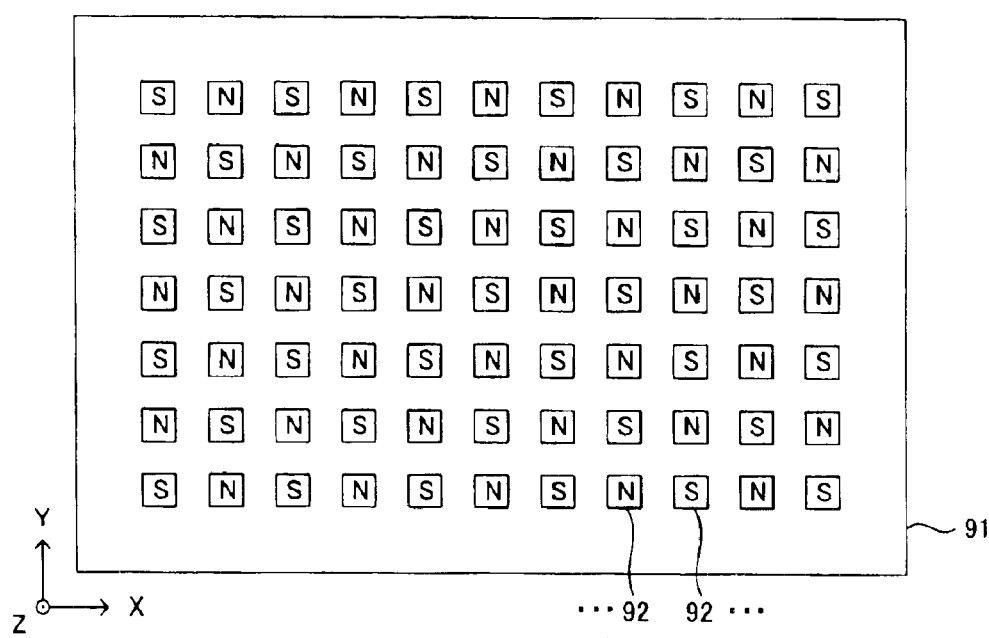
FIG. 11 is a plan view showing a metal plate for preparing a magnet array used upon fabricating the magnetic sensor shown in FIG. 1 and a permanent bar magnet inserted into the metal plate.

Subsequently, as shown in FIG. 11 that is a plan view, a rectangular metal plate 91 is prepared that is provided only with plural square through-holes arranged in a tetragonal lattice (i.e., square through-holes each having sides parallel to the X-axis and Y-axis are arranged along the X-axis and Y-axis so as to be spaced at equal intervals). Each of permanent bar magnets 92 . . . 92 with a shape of a rectangular parallelepiped having a square section approximately equal to each through-hole is inserted into each through-hole such that the edge face having a magnetic pole of the permanent bar magnet 92 . . . 92 formed thereon becomes parallel to the metal plate 91. At this time, the permanent bar magnets 92 . . . 92 are arranged such that the polarity of the magnetic pole is different from the adjacent polarity by the shortest route in a plane including each edge face of the permanent bar magnets 92 . . . 92. It is to be noted that each of the used permanent bar magnets 92 . . . 92 has magnetic charge whose magnitude is approximately equal to one another.

Figure 12:
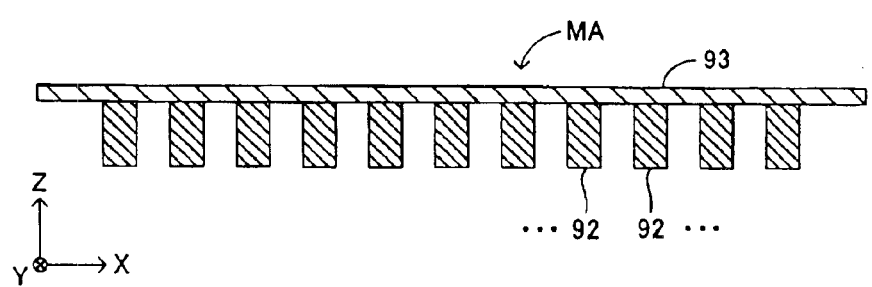
FIG. 12 is a sectional view of the magnet array used upon fabricating the magnetic sensor shown in FIG. 1.

Then, as shown in FIG. 12 that represents a section along X-Z plane, a plate 92 is prepared that is made of a transparent quartz glass having a thickness of about 0.5 mm and having a rectangular shape approximately equal to the metal plate 91. Thereafter, the upper surface (the surface opposite to the edge face on which the magnetic pole is formed) of the permanent bar magnets 92 . . . 92 and the bottom surface of the plate 93 are bonded by an adhesive, and then, the metal plate 91 is removed from below. At this stage, a magnet array MA is formed by the permanent bar magnets 92 . . . 92 and the plate 93, wherein plural permanent magnets, each having an approximately rectangular parallelepiped shape in which the sectional shape perpendicular to one central axis of the rectangular parallelepiped is approximately square, are arranged such that the center of gravity of the edge face having approximately square shape is matched with a lattice point of the tetragonal lattice, and the polarity of the magnetic pole of each permanent magnet thus arranged is different from the polarity of the magnetic pole of the adjacent other permanent magnet spaced by the shortest route.

Figure 13:
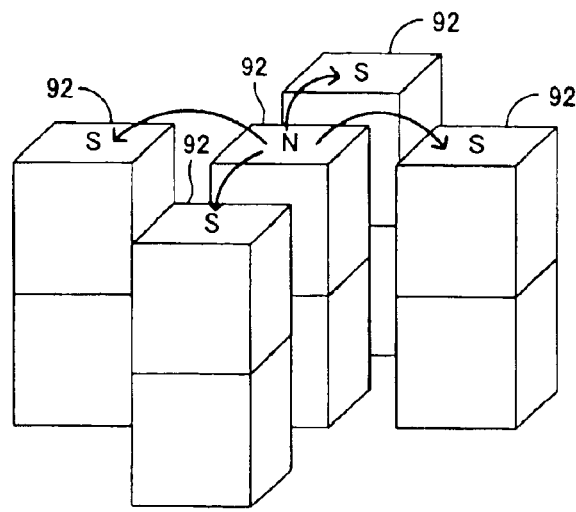
FIG. 13 is a perspective view wherein a part of a magnet of the magnet array shown in FIG. 12 is taken out.

FIG. 13 is a perspective view showing a state wherein only four permanent bar magnets 92 . . . 92 are taken out. As apparent from this figure, there are magnetic fields formed on the edge face (the edge face on which the magnetic pole is formed) of the permanent bar magnet 92 . . . 92, the magnetic fields from one N-pole directing to the S-poles adjacent to this N-pole by the shortest route and each having a different direction at an angle of 90 degrees. In this embodiment, this magnetic field is used as a magnetic field for magnetizing each bias magnet film 11b to 14b, 21b to 24b, 51b to 54b and 61b to 64b of each GMR element 11 to 14, 21 to 24, 51 to 54 and 61 to 64 and as a magnetic field for fixing the direction of magnetization in each fixed layer P (pinned layer in the fixed layer P).

Figure 14:
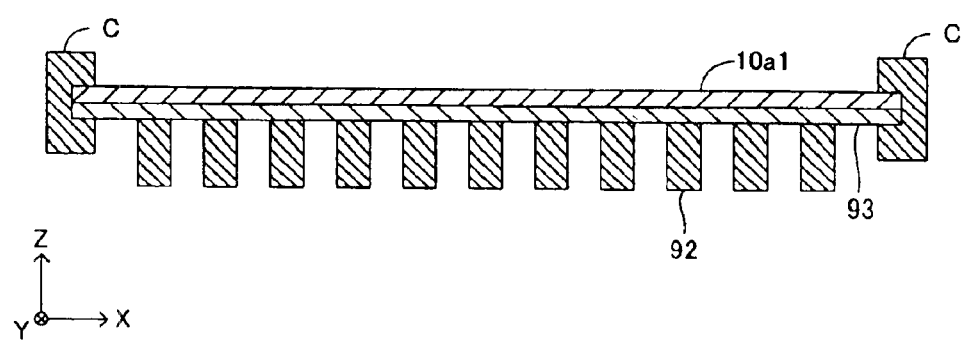
FIG. 14 is a view showing one of processes for fabricating the magnetic sensor shown in FIG. 1.
Figure 15:
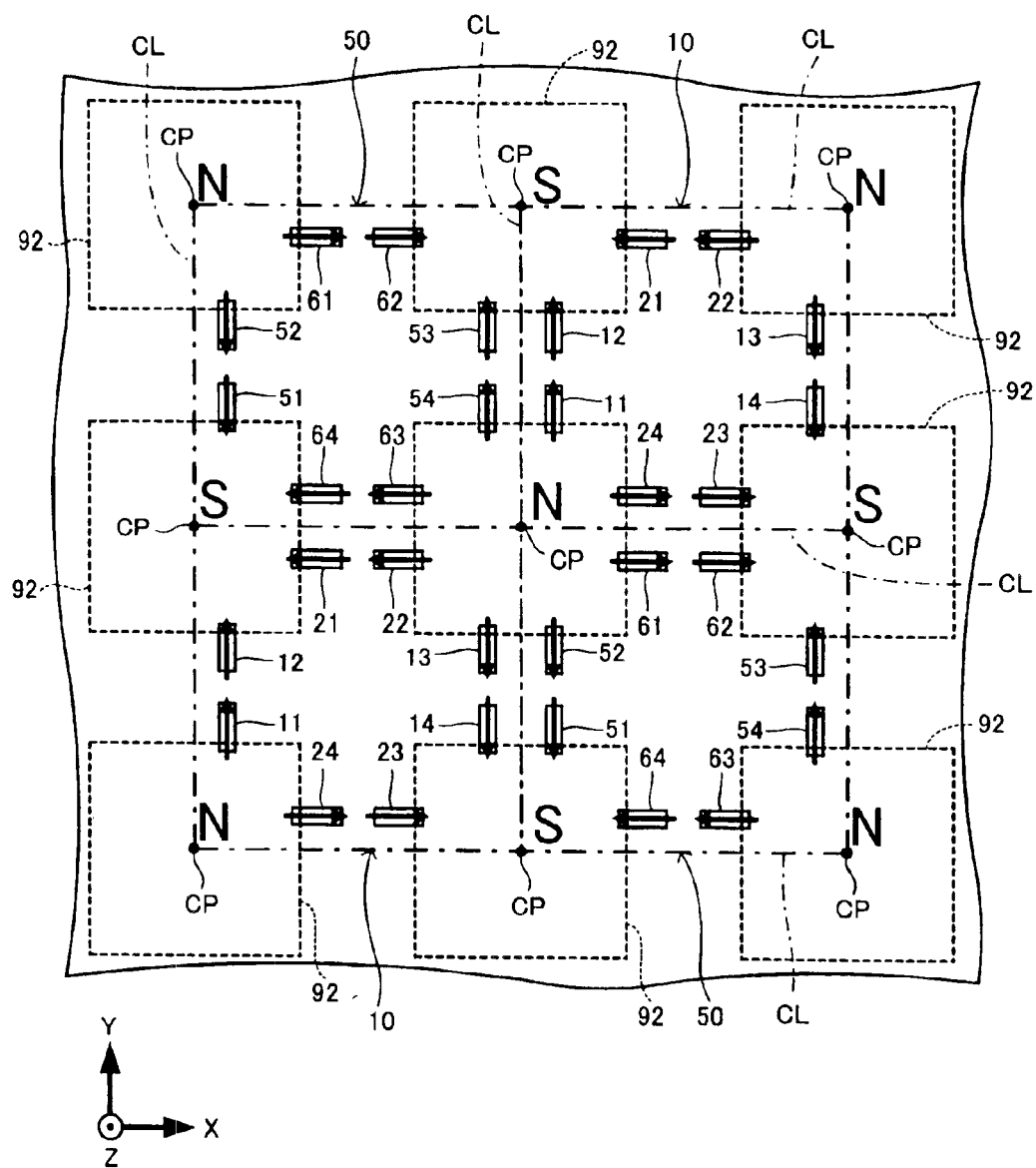
FIG. 15 is a conceptional view showing a method of magnetizing a bias magnet film of each GMR element of the magnetic sensor shown in FIG. 1.

Specifically, as shown in FIG. 14, the quartz glass 10a1 on which the film M which will become the GMR element is formed is firstly arranged such that the face having the film M which will become the GMR element formed thereon comes in contact with the upper surface of the plate 93, and then, the plate 93 and the quartz glass 10a1 are fixed to each other by a cramp C. At this time, as shown in FIG. 15 that is a plan view for enlarging the section that becomes later the magnetic sensors 10 and 50 by paying attention to the section corresponding to two of the magnetic sensors 10 and 50, the quartz glass 10a1 and the magnet array MA are relatively arranged such that each cross-point CP of the cutting plane line CL of the quartz glass 10a1 that becomes each side of the magnetic sensors 10 and 50 is matched with the respective center of gravity of the permanent bar magnets 92 . . . 92. Accordingly, as shown by arrows in FIG. 15, a magnetic field is applied to each film M which will become the GMR element in the longitudinal direction of the narrow zonal portion of each film M in the state wherein the quartz glass 10a1 is placed on the upper surface of the plate 93.

The present embodiment utilizes this magnetic field for magnetizing the bias magnet films 11b to 14b, 21b to 24b, 51b to 54b and 61b to 64b as well as for matching the direction of magnetization in each magnetic domain in the free layer F with the direction in the initial state. That is, magnetization in each magnetic domain in the free layer F is initialized.

Figure 16:
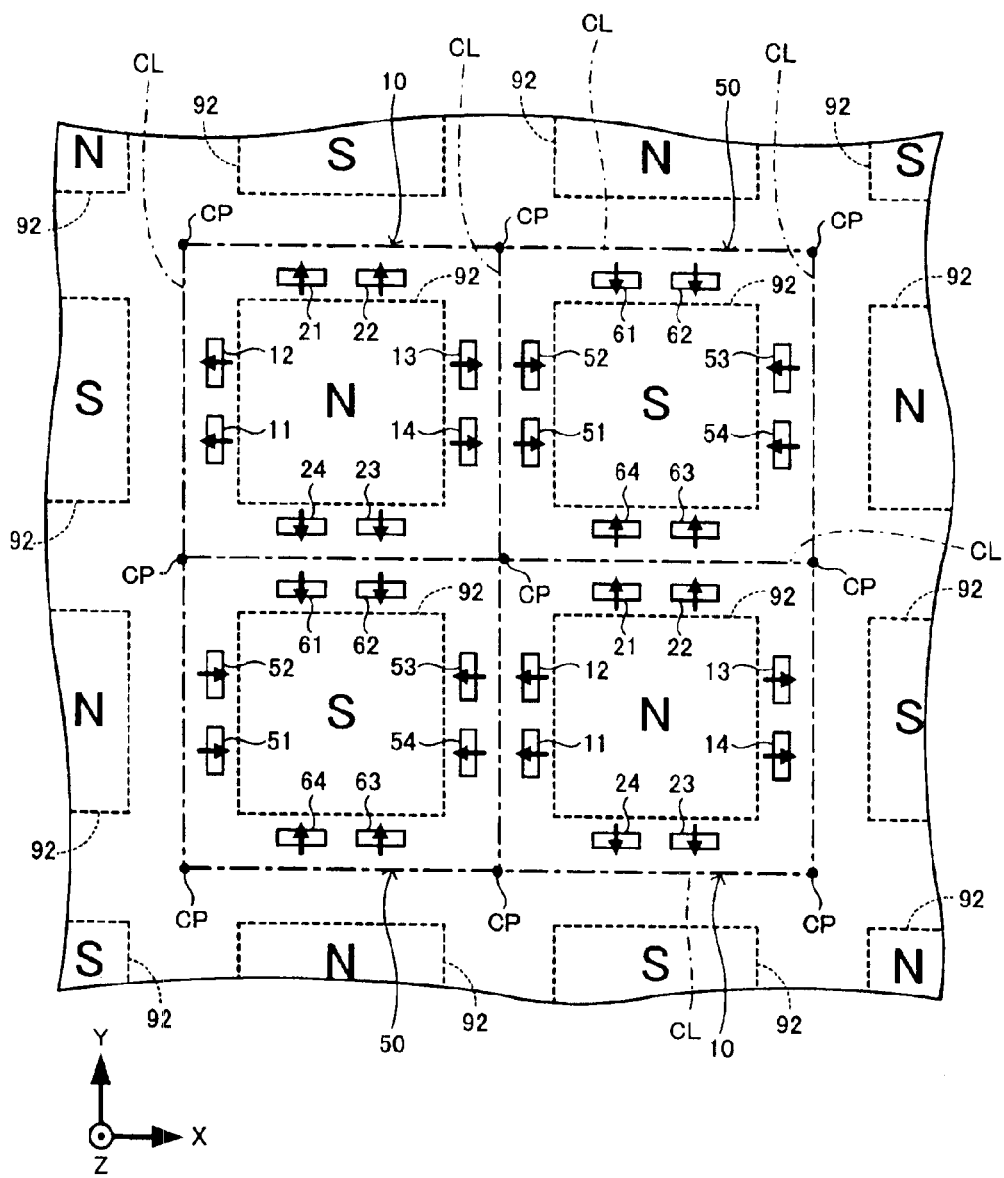
FIG. 16 is a conceptional view showing a method of pinning a direction of magnetization in the pinned layer of each GMR element of the magnetic sensor shown in FIG. 1.
Figure 17A:
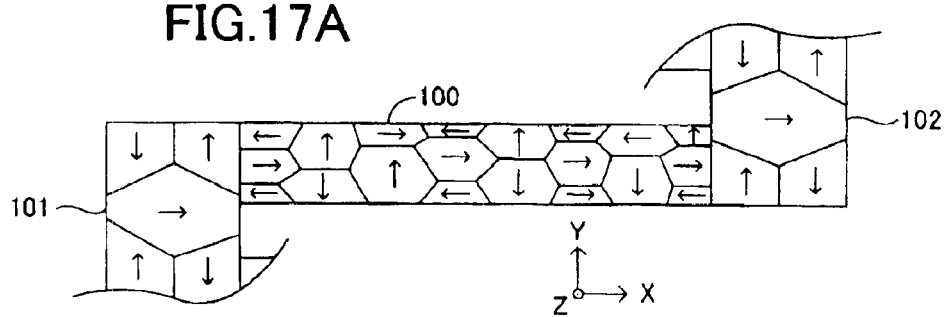
Figure 17B:
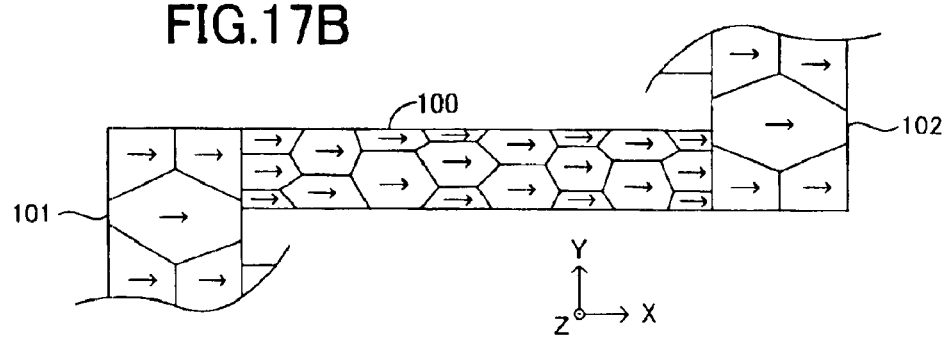
Figure 17C:
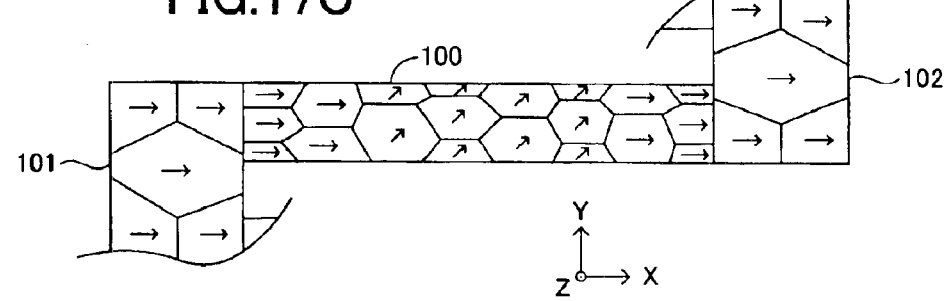
Figure 17D:
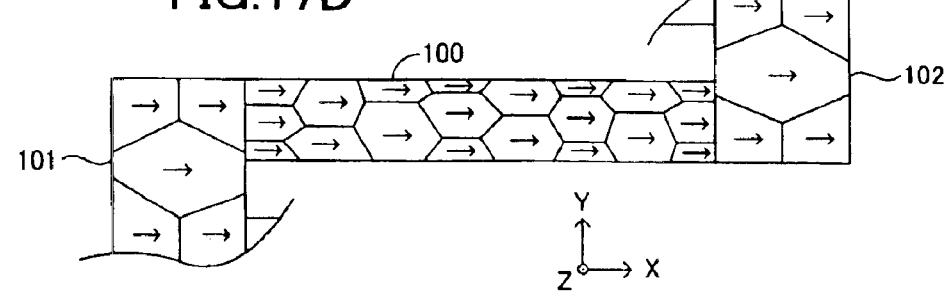
Figure 18A:
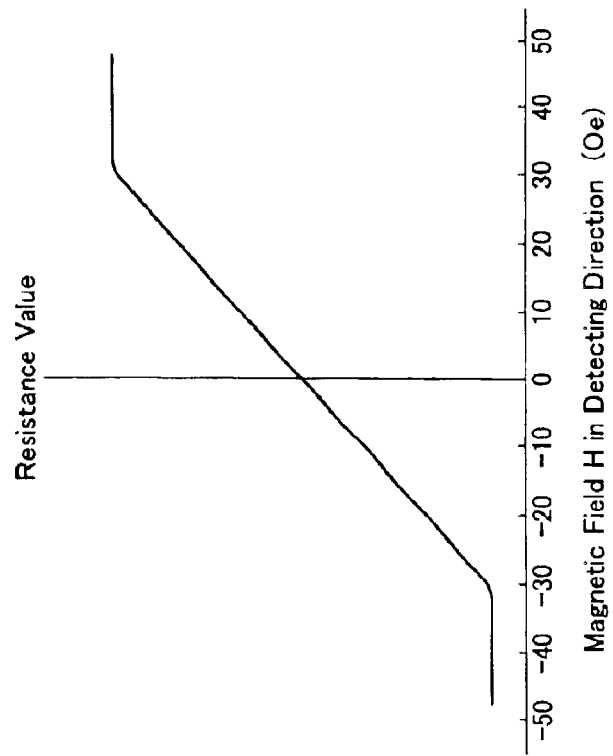
FIG. 18A is a graph showing a resistance change, for the external magnetic field, of the GMR element in a state before the bias magnet films are magnetized.
Figure 18B:
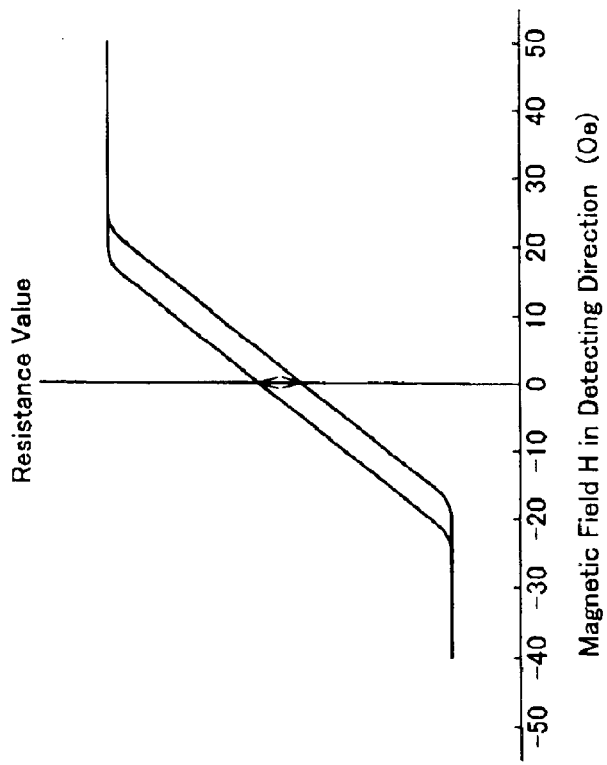
FIG. 18B is a graph showing a resistance change, for the external magnetic field, of the GMR element in a state after the bias magnet films are magnetized.
Figure 19A:
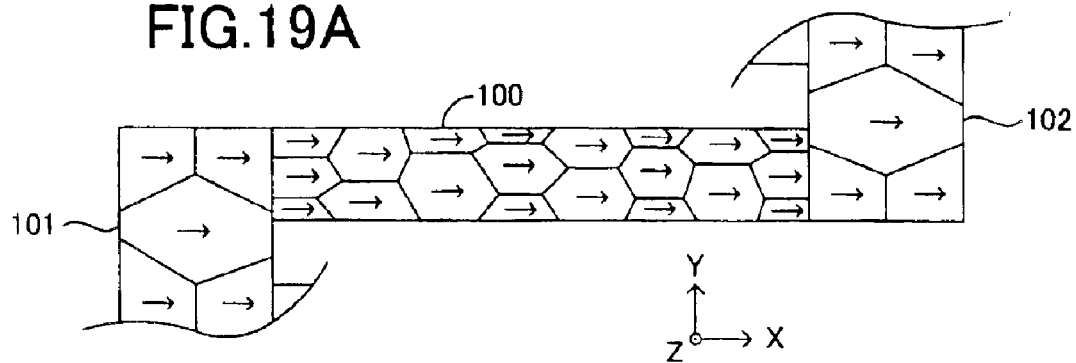
Figure 19B:
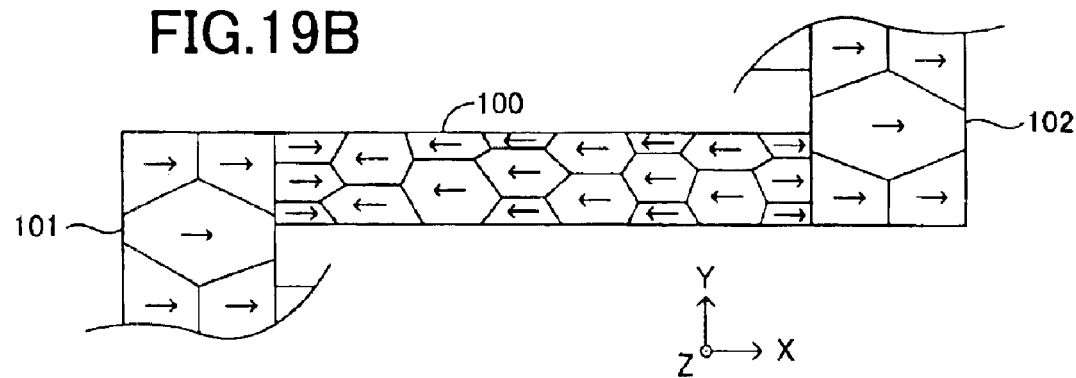
Figure 19C:
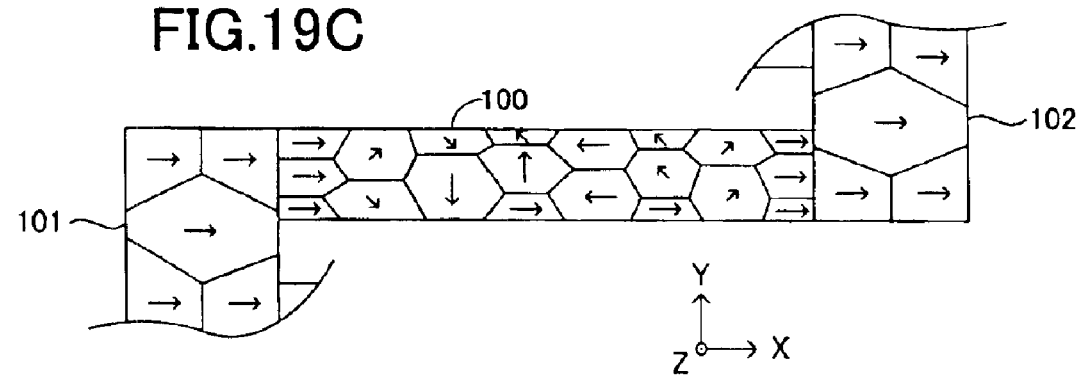

Subsequently, the relative relationship between the quartz glass 10a1 having the film M which will become the GMR element formed thereon and the magnet array MA (plate 93) is changed as shown in a plan view of FIG. 16, whereby the surface on which the film M which will become the GMR element is formed is arranged to be brought into contact with the upper surface of the plate 93. At this time, the quartz glass 10*a*1 and the magnet array MA are relatively arranged such that each cross-point of the cutting plane line CL of the quartz glass 10*a*1 that becomes each side of the magnetic sensors 10 and 50 is matched with the respective center of gravity of the four adjacent permanent bar magnets 92 . . . 92. Accordingly, as shown by arrows in FIG. 16, a magnetic field is applied to each film M which will become the GMR element in the direction perpendicular to the longitudinal direction of the narrow zonal portion of each film M in the state wherein the quartz glass 10*a*1 is placed on the upper surface of the plate 93.

The present embodiment utilizes this magnetic field for performing a heat treatment (annealing for ordering) to fix the direction of magnetization in the fixed layer P (pinned layer of the fixed layer P). Specifically, the plate 93 and the quartz glass 10*a*1 are fixed to each other by the cramp C with the state shown in FIG. 16, then, the resultant is heated in a vacuum to 250 to 280° C. and left for about four hours in this state.

Figure 10:
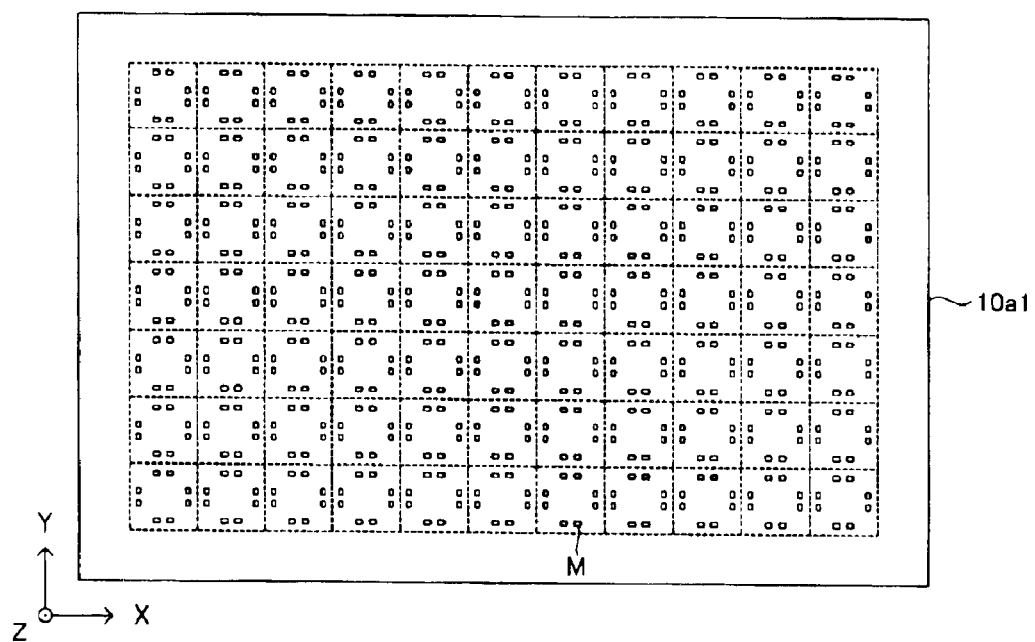
FIG. 10 is a plan view of a quartz glass, during a process for fabricating the magnetic sensor shown in FIG. 1, having the spin valve film formed thereon.

Thereafter, the quartz glass 10*a*1 is removed to form a wiring or the like for connecting each film M, and finally, the quartz glass 10*a*1 is cut along the broken line (or the cutting line CL) shown in FIG. 10 etc. As described above, a great number of magnetic sensors 10 and 50 shown in FIG. 1 are simultaneously produced.

As described above, a magnetic sensor according to the embodiment of the present invention has bias magnet films 11*b* . . . 11*b* provided at both ends of the free layer F in the longitudinal direction for producing in the free layer a bias magnetic field in a predetermined direction (in the longitudinal direction of the free layer), whereby the direction of magnetization in each magnetic domain in the free layer can stably be maintained in the predetermined direction when an external magnetic field is not present.

Further, the initializing coils 31 to 34 and 41 to 44 are energized under a predetermined condition to thereby generate an initializing magnetic field for returning the direction of magnetization in each magnetic domain in the free layer to the direction (i.e., the longitudinal direction of the free layer) same as the direction of the bias magnetic field by the bias magnet films, whereby the direction of magnetization in each magnetic domain in the free layer can assuredly be returned to the initial state even if the direction of magnetization is disturbed by applying a strong magnetic field to the free layer. As a result, a hysteresis that occurs when the external magnetic field is in the vicinity of "0" with respect to the change of the external magnetic field can be maintained small of the magnetic sensors 10 and 50. Thus, the magnetic sensor is capable of detecting a minute magnetic field with high precision over a long period.

Further, according to the production process of the magnetic sensor according to the embodiment of the present invention, there is prepared a magnet array MA that is configured such that plural permanent magnets are arranged at a lattice point of a tetragonal lattice and the polarity of the magnetic pole of each permanent magnet is different from the polarity of the other adjacent magnetic pole spaced by the shortest route. Therefore, the direction of magnetization in each magnetic domain in the free layer is initialized and the bias magnet films are magnetized, and further, a pinning is performed by pinning the direction of magnetization in the magnetic layer that becomes a pinned layer. Accordingly, plural GMR elements having different magnetic field detecting directions (perpendicular to each other) can easily and efficiently be formed on a single chip, thereby being capable of manufacturing with low cost a magnetic sensor of a single chip which is capable of detecting at least respective magnetic fields whose magnitude is changed in the directions perpendicular to each other.

It should be noted that, in the above embodiment, the films M for GMR films (films M which will be the GMR elements) are formed after the bias films (films for magnets) are patterned, and the films M for GMR films are annealed for ordering after the GMR films are patterned. However, the annealing process for ordering can be performed before the films M for GMR films are patterned. Further, the bias films can be formed after the films M for GMR films are formed.

Figure 21:
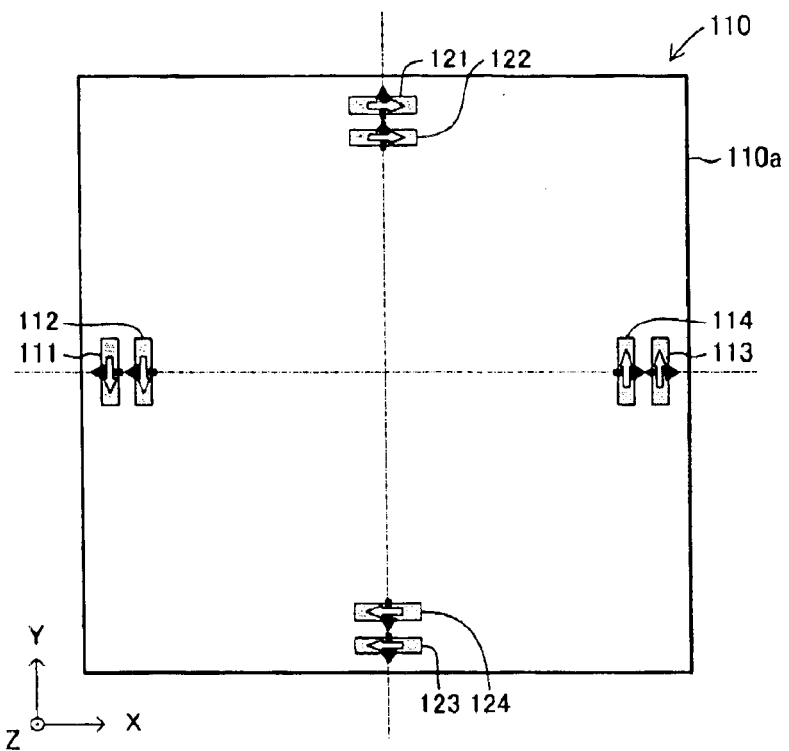
FIG. 21 is a plan view of a magnetic sensor (N-type) in accordance with another embodiment of the present invention.
Figure 22:
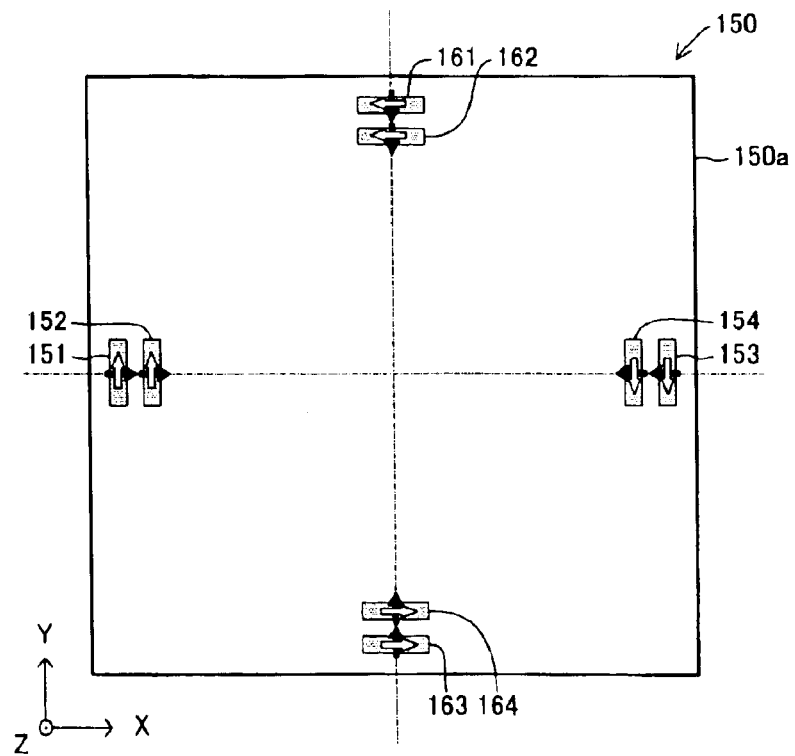
FIG. 22 is a plan view of a magnetic sensor (S-type) in accordance with another embodiment of the present invention.

Next, another embodiment of a magnetic sensor (second embodiment) in accordance with the present invention will be described. This magnetic sensor is also classified into N-type shown in FIG. 21 which is a plan view of the N-type sensor and S-type shown in FIG. 22 which is a plan view of the S-type sensor. The N-type magnetic sensor 110 and the S-type magnetic sensor 150 have substantially the same shape and same configuration except that a direction of fixed magnetization in a pinned layer shown by black-solid arrows in FIGS. 21 and 22 and a direction of magnetization in an initial state in a free layer shown by outline arrows in FIGS. 21 and 22 are different from each other. Note that, initializing coils are omitted in FIGS. 21 and 22.

The N-type magnetic sensor 110 has the same structure as the N-type magnetic sensor 10 except the position of the GMR elements and the initializing coils. The N-type magnetic sensor 110 comprises a single chip 110*a* which is the same as the single chip 10*a*, insulating layers which is the same as the insulating layers 10*b*, a total of eight GMR elements 111 to 114, 121 to 124 formed on the uppermost layer of the insulating layers and a total of eight initializing coils (coils for initializing). A relative positional relationship between the GMR elements 111 to 114, 121 to 124 and the eight initializing coils is the same as that between the GMR elements 11 to 14, 21 to 24 and the initializing coils 31 to 34, 41 to 44. The GMR elements 111 to 114 form an X-axis magnetic sensor by being full-bridge-connected similarly to the GMR elements 11 to 14. The GMR elements 121 to 124 form an Y-axis magnetic sensor by being full-bridge-connected similarly to the GMR elements 21 to 24.

The first X-axis GMR element 111 is formed at an almost central portion in the Y-axis direction of the chip 110*a* and in the vicinity of an end portion of the X-axis negative direction. The second X-axis GMR element 112 is formed at an almost central portion in the Y-axis direction of the chip 110*a* and at a portion spaced by a predetermined short distance in the X-axis positive direction from the first X-axis GMR element 111. The third X-axis GMR element 113 is formed at an almost central portion in the Y-axis direction of the chip 110*a* and in the vicinity of an end portion of the X-axis positive direction. The fourth X-axis GMR element 114 is formed at an almost central portion in the Y-axis direction of the chip 110*a* and at a portion spaced by a predetermined short distance in the X-axis negative direction from the third X-axis GMR element 113. An each of longitudinal directions of the first to fourth X-axis GMR elements 111 to 114 is parallel to the Y-axis direction.

The first Y-axis GMR element 121 is formed at an almost central portion in the X-axis direction of the chip 110*a* and in the vicinity of an end portion of the Y-axis positive direction. The second Y-axis GMR element 122 is formed at an almost central portion in the X-axis direction of the chip 110a and at a portion spaced by a predetermined short distance in the Y-axis negative direction from the first Y-axis GMR element 121. The third Y-axis GMR element 123 is formed at an almost central portion in the X-axis direction of the chip 110a and in the vicinity of an end portion of the Y-axis negative direction. The fourth Y-axis GMR element 124 is formed at an almost central portion in the X-axis direction of the chip 110a and at a portion spaced by a predetermined short distance in the Y-axis positive direction from the third Y-axis GMR element 123. An each of longitudinal directions of the first to fourth Y-axis GMR elements 121 to 124 is parallel to the X-axis direction.

The S-type magnetic sensor 150 has the same structure as the S-type magnetic sensor 50 except the position of the GMR elements and the initializing coils. The magnetic sensor 150 comprises a single chip 150a which is the same as the single chip 50a, insulating layers which is the same as the insulating layers 10b, a total of eight GMR elements 151 to 154, 161 to 164 formed on the uppermost layer of the insulating layers and a total of eight initializing coils (coils for initializing). A relative positional relationship between the GMR elements 151 to 154, 161 to 164 and the eight initializing coils is the same as that between the GMR elements 51 to 54, 61 to 64 and the initializing coils 71 to 74, 81 to 84. The GMR elements 151 to 154 form an X-axis magnetic sensor by being full-bridge-connected similarly to the GMR elements 51 to 54. The GMR elements 161 to 164 form an Y-axis magnetic sensor by being full-bridge-connected similarly to the GMR elements 61 to 64.

A positional relationship between the first to fourth X-axis GMR elements 151 to 154 and the substrate 150a is the same as that between the first to fourth X-axis GMR elements 111 to 114 and the substrate 110a. An each of longitudinal directions of the first to fourth GMR elements 151 to 154 is parallel to the Y-axis direction. A positional relationship between the first to fourth Y-axis GMR elements 161 to 164 and the substrate 150a is the same as that between the first to fourth Y-axis GMR elements 121 to 124 and the substrate 110a. An each of longitudinal directions of the first to fourth GMR elements 161 to 164 is parallel to the X-axis direction.

Subsequently explained is a process for manufacturing the magnetic sensors 110 and 150 thus configured as described above. In this process, the magnet array MA described above and a magnet array MB which is different from the magnet array MA are used.

Firstly, the magnet array MA is prepared by the process mentioned above and the magnet array MB is prepared by the following process below. Prior to the process to make the magnet array MB, each of parts that constitute magnet array MB is explained. The magnet array MB comprises a yoke (yoke plate) 200, a substrate for the array 210 and plural permanent magnets (permanent bar magnets) 230.

Figure 23:
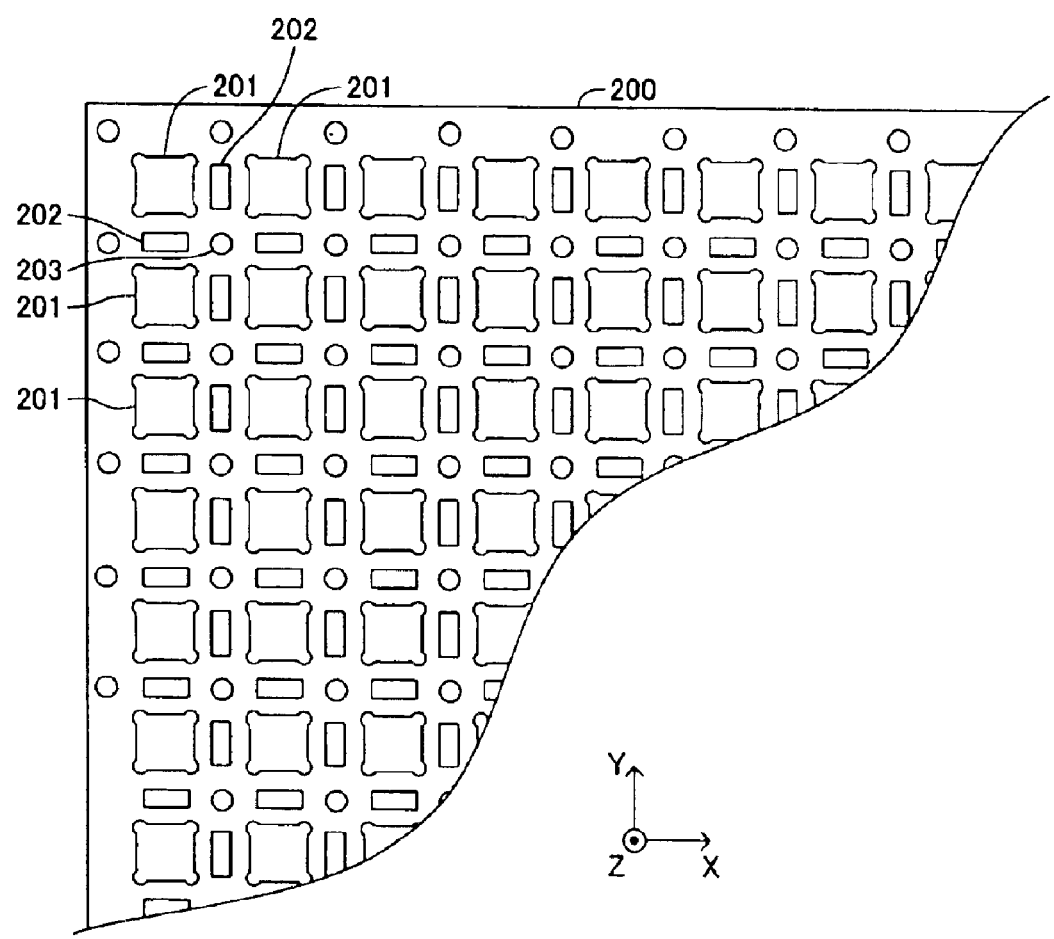
FIG. 23 is a fragmentary plan view of the yoke of the magnet array MB in accordance with the present invention.
Figure 24:
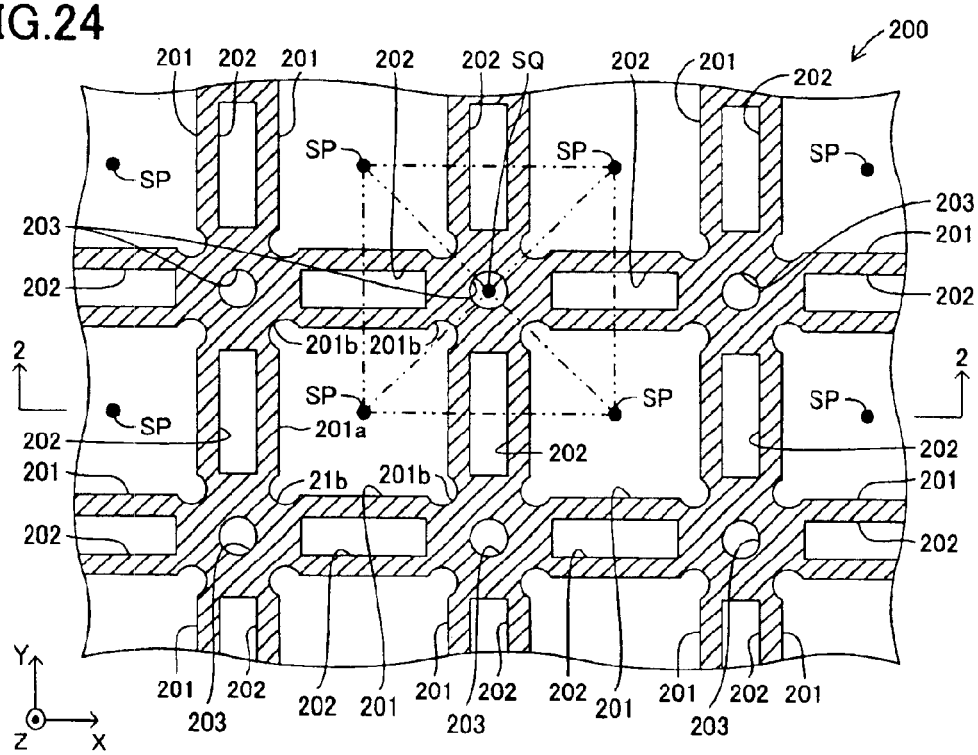
FIG. 24 is a fragmentary enlarged plan view of the yoke shown in FIG. 23.
Figure 25:
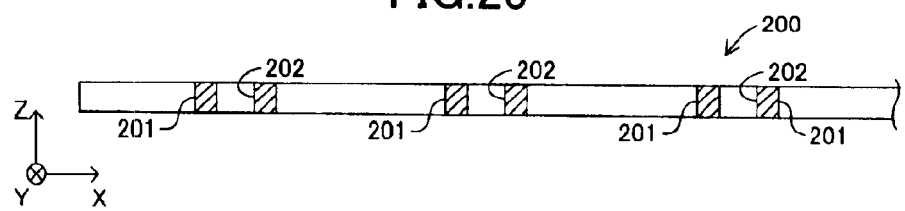
FIG. 25 is a sectional view of the yoke shown in FIG. 24 cut by a plane along a line 2—2 in FIG. 24.

The yoke 200 is shown in FIGS. 23, 24 and 25. FIG. 23 is a fragmentary plan view of the yoke 200, FIG. 24 is an enlarged plan view of FIG. 23 and FIG. 25 is a sectional view of the yoke shown in FIG. 24 cut by a plane along a line 2—2 in FIG. 24. This yoke 200 is a thin plate formed of magnetic material which has larger permeability than air (e.g., 42 alloy . . . Fe—42Ni alloy and the like). Preferably, yoke 200 can be formed of high saturation—high permeability material such as permalloy or silicon steel (silicon sheet). The planar shape of the yoke is rectangle. The plate thickness of the yoke 200 is 0.15 mm in this example. The yoke 200 has plural thorough holes 201. The through hole 201 has an approximately square shape viewed in a plane. The plural through holes 201 are arranged in a tetragonal lattice. Specifically, the through holes 201 are disposed such that each center of gravity of the through holes 201 is matched with a lattice point SP of the tetragonal lattice shown in FIG. 24. As viewed in a plane, a certain side of sides forming the through hole 201 is parallel to a certain side of sides forming the adjacent through hole 201. In other words, a certain side of sides forming the through hole 201 and a certain side of sides forming other through hole 201 located on the same row (or column) of the tetragonal lattice are on (in) a same straight line.

Figure 26:
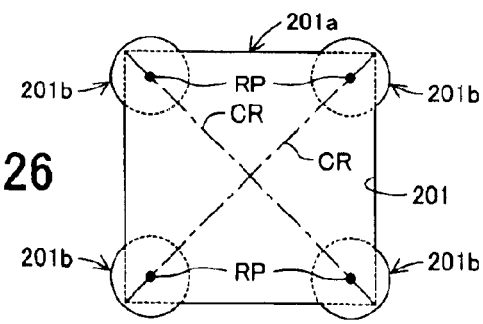
FIG. 26 is a plan view of a through hole of the yoke shown in FIG. 23.

Each of the through holes 201, as shown in FIG. 26 showing a planar shape of the through hole 201, has a shape composed of a square portion 201a and margin portions (circle arc portions or R portions) 201b viewed in a plane. A shape of the square portion 201a is a square. The margin portion 201b swells outwardly from the square at each of corners of the square portion 201a. Specifically, an outer shape (outline) of the margin portion 201b is a circle arc whose center PR is on a diagonal line CR of the square portion 201a.

Through openings 202 serving as air gaps are formed between the through hole 201 and the other adjacent through hole 201 spaced by the shortest route from the former through hole 201 (i.e., between through holes 201, 201 that are adjacent each other with a shortest distance). A shape of the through opening 202 is approximately a rectangle in viewed in a plane. A longer side of the through opening 202 is parallel to a side of the square portion 201b of the through hole 201 next to the same through opening 202. Length of the longer side of the through opening 202 is approximately the same as or is slightly shorter than length of the side of the square portion 201a. Length of the shorter side of the through opening 202 is longer than length of the longer side (side in the longitudinal direction) of each of the films M which will become GMR elements 111 to 114, 121 to 124, 151 to 154 and 161 to 164.

The yoke 200 has openings (openings for controlling magnetic flux) 203. The opening 203, viewed in a plane, is formed at a region surrounding a center of gravity SQ of a square drawn by lines connecting the lattice points of the tetragonal lattice. One of the openings 203 has a shape of a circle whose center is on the center of gravity SQ viewed in a plane.

Figure 27:
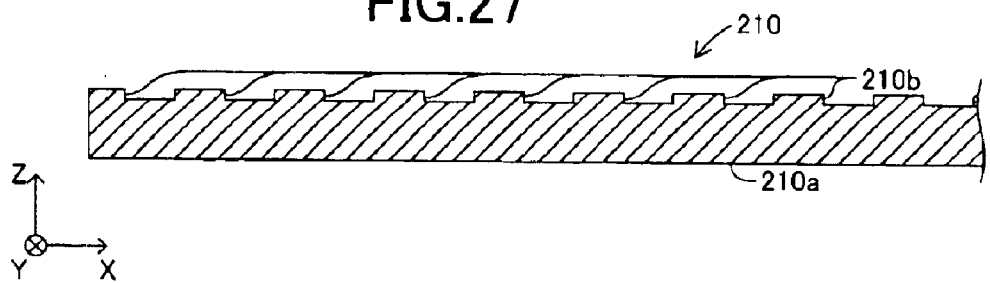
FIG. 27 is a sectional view of a substrate for the magnet array MB in accordance with the present invention.
Figure 28:
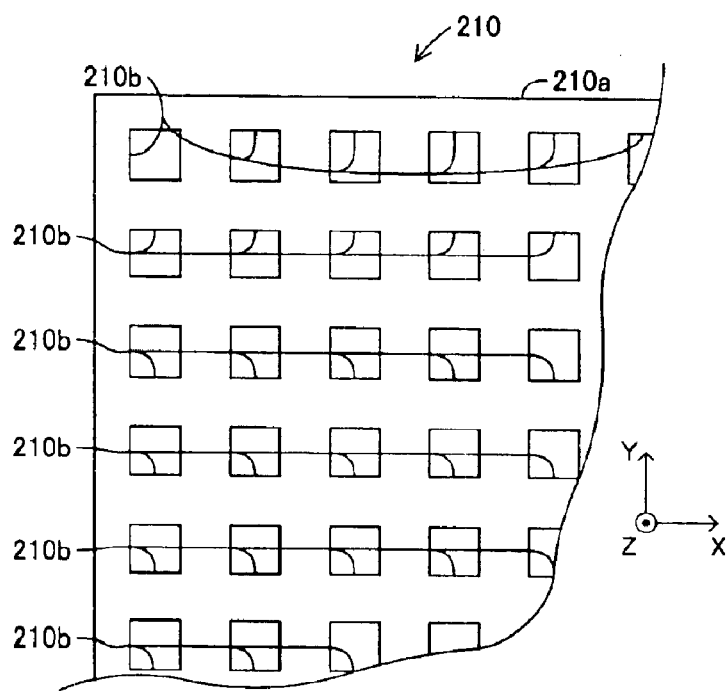
FIG. 28 is a fragmentary plan view of the substrate for the array shown in FIG. 27.
Figure 29:
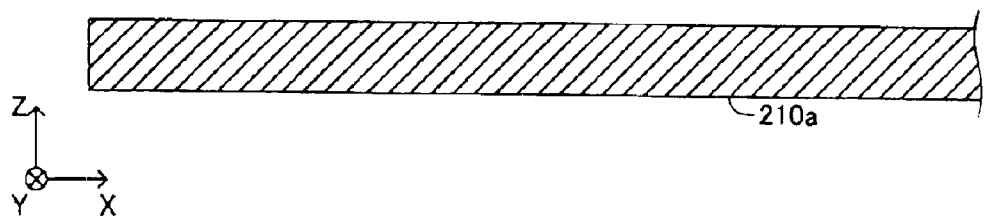
FIG. 29 is a sectional view of a thin plate which will become the substrate for the array shown in FIG. 27.

The substrate for the array 210, shown in FIGS. 27 and 28, is a substrate made by processing a thin plate 210a, shown in FIG. 29, formed of magnetic material (e.g., permalloy). The substrate for the array 210 has almost the same shape as the yoke 200 viewed in a plane. The substrate for the array 210 includes plural concavities (ditches) 210b. Plural concavities 210b are formed at the same positions (same locations) as the through holes 201 of the yoke 200. A shape of the concavity 210b is almost the same as the shape of the square portion 201a of the through hole 201.

Figure 31:
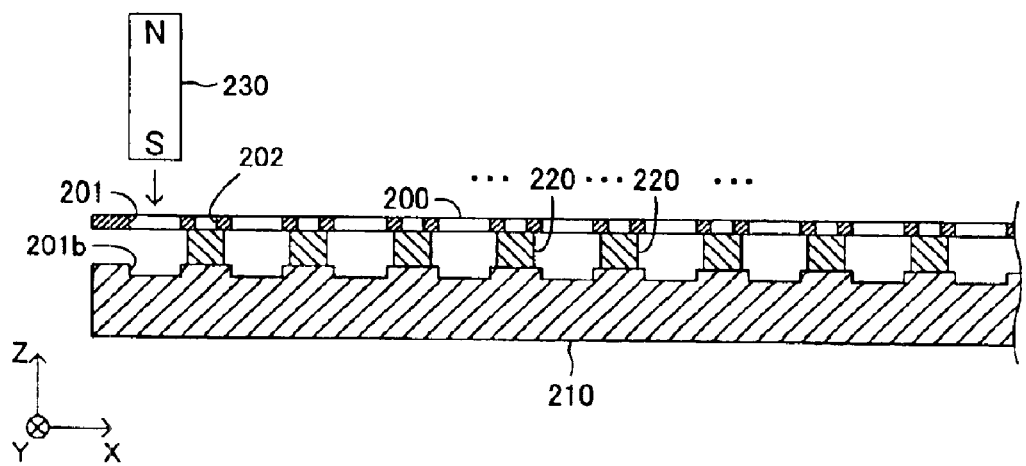
FIG. 31 is a view showing one of processes for fabricating the magnet array MB.
Figure 32:
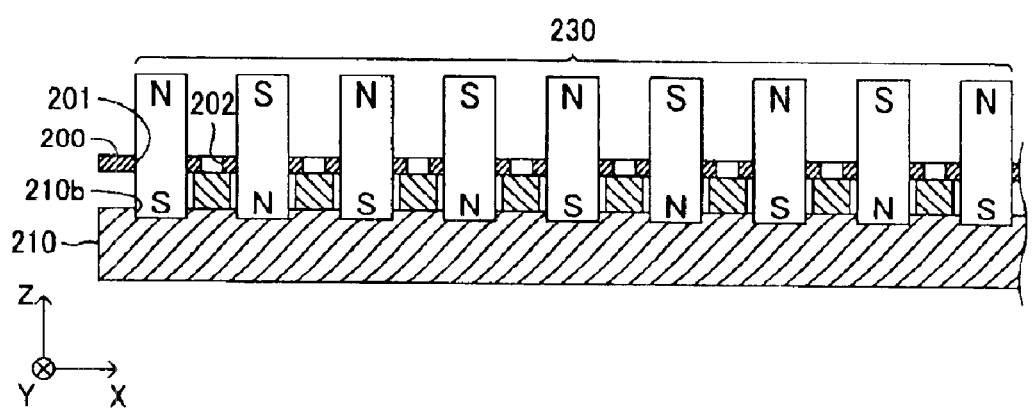
FIG. 32 is a view showing one of processes for fabricating the magnet array MB.

The permanent bar magnets 230 has a shape of a rectangular parallelepiped shape (see. FIG. 31). The permanent bar magnet 230 has a sectional shape, perpendicular to one relatively longer central axis of the rectangular parallelepiped, which is an approximately square shape approximately same as the shape of the through hole 201 (and the concavity 210b). Poles of the permanent bar magnet 230 are formed at both edge faces each of which has the square shape. Magnitude of each of magnetic charges of the plural permanent bar magnets 230 is approximately equal to one another.

Subsequently explained is a process for manufacturing the magnet array MB. Firstly, a thin plate which will become the yoke 200 is prepared. The through holes 201, the through openings 202 and the openings 203 are formed in the thin plate by etching. Next, the concavities 210b are formed on the thin plate 210a which will become the substrate for the array 210 by etching (by half-etching).

Figure 30:
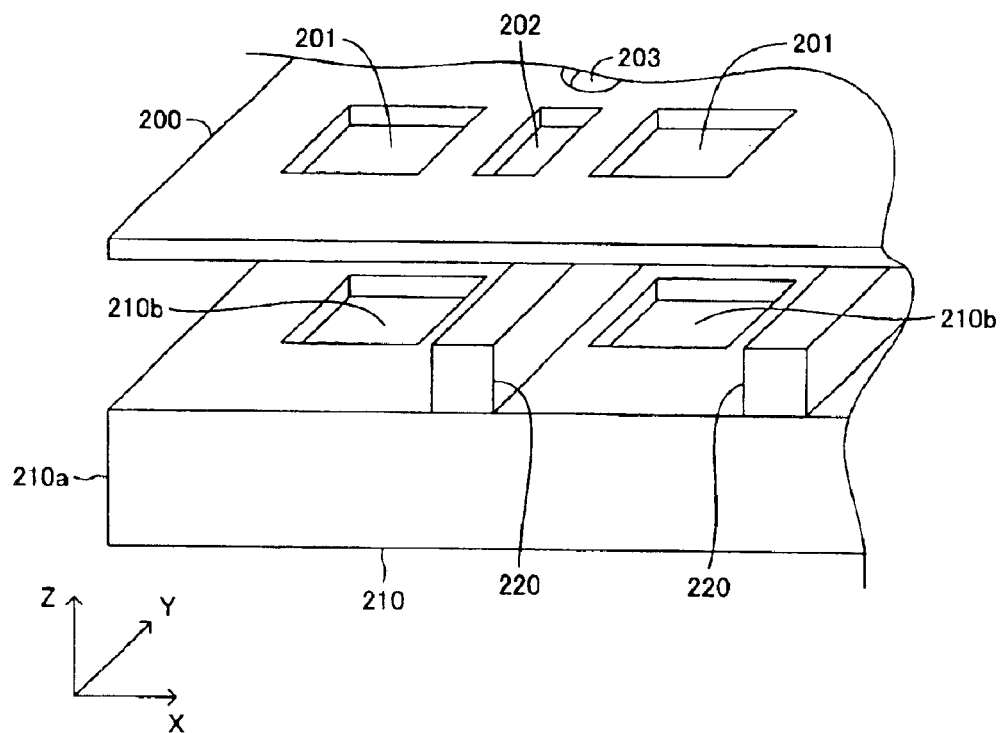
FIG. 30 is a view showing one of processes for fabricating the magnet array MB.

Next, square column-like spacers (bar) 220 are disposed on the substrate for the array 210, as shown in FIG. 30 which is a perspective view and in FIG. 31 which is a sectional view. The spacers 220 are placed between one row constituted by the plural concavities 210b and the other row, constituted by the plural concavities 210b, which is next to and is parallel to the former row. When the spacers 220 are arranged in this manner, length of the spacer 220 along the Z-axis direction is shorter than length between both edge faces having magnetic poles of the permanent bar magnet 230. Note that the margin portions 201b are omitted in FIG. 30.

Subsequently, the yoke 200 is placed (disposed or arranged) on the spacers 220. At this time, the yoke 200 is arranged in such a manner that the through holes 201 (the square portions 201a) of the yoke 200 and the concavities 210b of the substrate for the array 210 coincide in a plan view. In other words, in a state where the yoke 200 is disposed on the spacers 220, each of the concavities 210b coincides with each one of the through holes 201 in a Z-axis direction. Note that a mark for determining position of them (i.e., an alignment mark) may be formed on the yoke 200 and the substrate for the array 210.

Next, each of the plural permanent bar magnets 230 is inserted into each of the plural through holes 201. At the time of the insertion of the permanent bar magnets 230, one of the edge faces having magnetic poles of the permanent bar magnets 230 is made to be in abutment (contact) with each of upper surfaces of the concavities 210b of the substrate for the array 210. As a result, the other edge faces having magnetic poles of the permanent bar magnets 230 (this face is also simply referred to as "upper surface" of the magnet 230 hereinafter) is placed (disposed) in a same plane (on a single plane). Also, at this time, in the plane where the upper surfaces of the magnet 230 is disposed, a polarity of a magnet pole of each permanent magnet 230 is different from (opposite to) a polarity of the other adjacent magnet pole spaced by the shortest route (i.e., shortest distance). Accordingly, the permanent bar magnet 230 is arranged as shown in FIG. 23. In this stage, a movement of the permanent bar magnets 230 in a side direction (in a transverse direction) is prohibited because the magnets 230 are inserted into both the through holes 201 of the yoke 200 and the concavities 210b.

Figure 33:
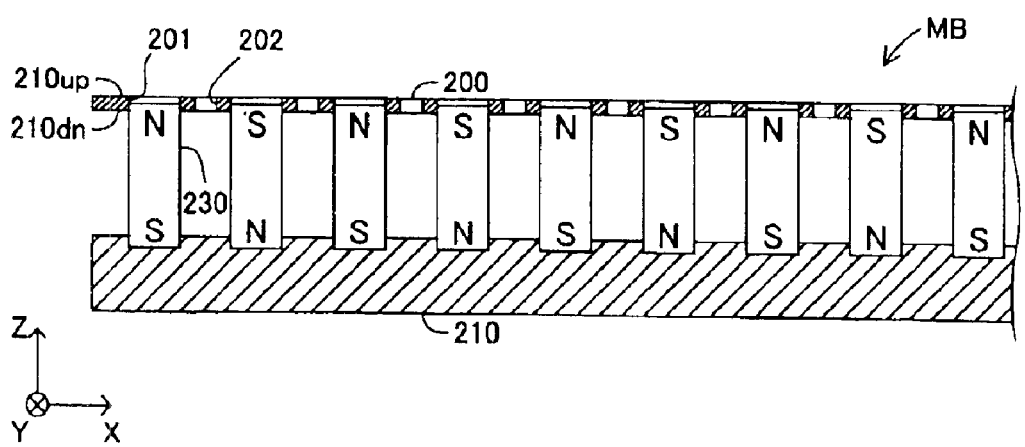
FIG. 33 is a view showing one of processes for fabricating the magnet array MB.

Next, the yoke 200 is lifted upwardly (in the Z-axis positive direction) by utilizing the openings 203 of the yoke 200. More specifically, two of the openings 203 are grasped with tweezers and the yoke 200 is lifted by the tweezers. This operation is repeated for the other openings 203 and the whole yoke is gradually lifted upward. At this time, as shown in FIG. 33, height of the yoke 200 (distance between the yoke 200 and the substrate for the array 210) is adjusted in such a manner that the plane formed by the upper surfaces of the permanent bar magnets 230 (i.e., all the other edge faces having magnetic poles of the permanent bar magnets 230) is placed between an upper surface 200up of the yoke 200 and a lower surface 200dn of the yoke 200. In other words, the yoke 200 is lifted upwardly such that the upper surface of the permanent bar magnet 230 is made to be within plate thickness of the yoke 200. It should be noted that a plane formed by the upper surface 200up of the yoke 200 coincides with a plane formed by the upper surfaces of the permanent bar magnets 230. Then, the spacers are taken out and the yoke 200 is fixed to the substrate for the array 210. The magnet array MB is thus completed.

Figure 34:
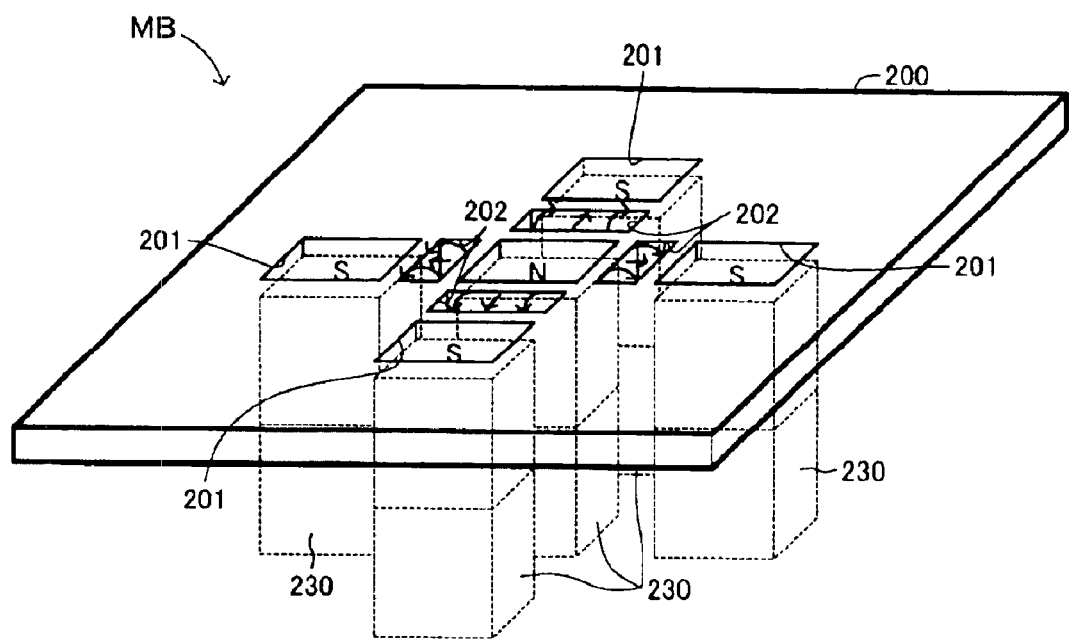
FIG. 34 is a perspective view wherein a part of a magnet of the magnet array MB and the yoke are taken out.

FIG. 34 is a perspective view showing a state wherein only four permanent bar magnets 230 . . . 230 are taken out. As is apparent from this figure, there are provided magnetic fields from one N-pole directing to the S-poles adjacent to this N-pole by the shortest route and each having a different direction at an angle of 90 degrees, above the upper surfaces (edge faces having the pole) of the permanent bar magnets 230 . . . 230. In this embodiment, this magnetic field given by the magnet array MB is used as a magnetic field for magnetizing each bias magnet film of each GMR element 111 to 114, 121 to 124, 151 to 154 and 161 to 164.

Figure 35:
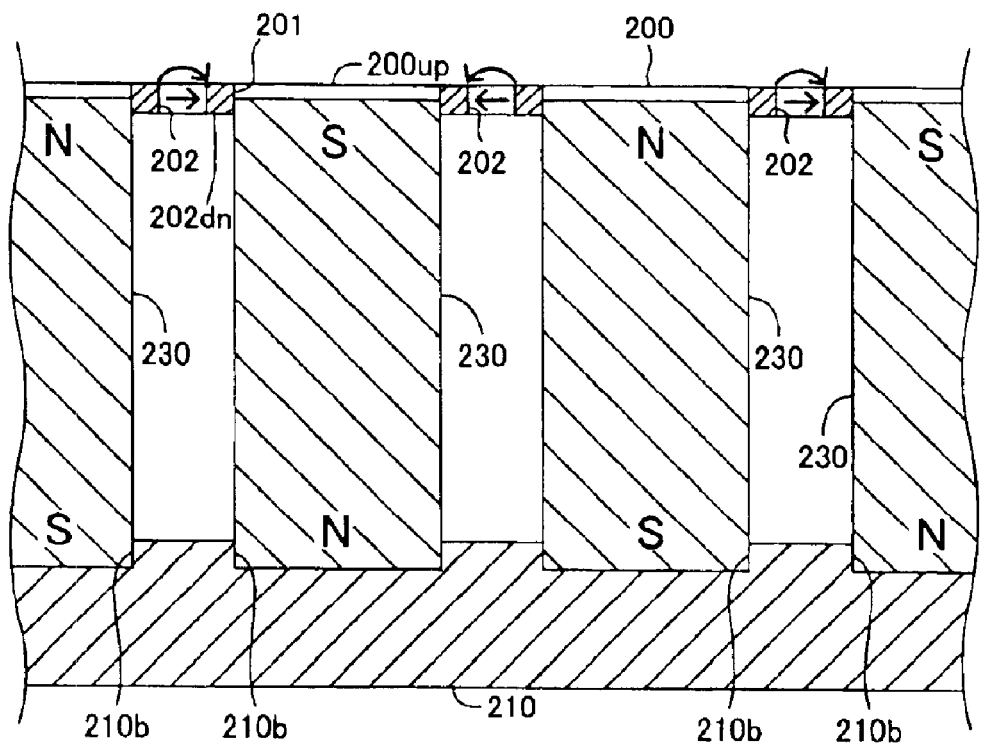
FIG. 35 is a fragmentary sectional view of the magnet array MB.

This magnet array MB has through openings 202 serving as air gaps formed between two of (upper surfaces of) the permanent bar magnets 230 that are spaced by the shortest route and next to each other. With this cinfiguration, as shown in FIG. 35, magnetic flux concentrates both in the through openings 202 and in a space close to the through openings 202. In other words, the magnet array MB can provide a narrow space local region with a magnetic field whose magnitude is great and whose direction is stably constant.

FIGS. 36 and 37 show states of magnetic flux generated by the magnet array MB and the magnet array MA by arrows, respectively. As understood by comparing one of the figures with the other figure, the magnet array MB has not only above mentioned through openings 202 but also openings 203, and therefore, it can make the magnetic field formed between both the permanent bar magnets that are next to each other and are spaced by the shortest route more linear and can provide locally the magnetic field which is more stable and whose magnitude is greater than the magnetic field provided by the magnet array MA.

With these steps mentioned above, the magnet array MA and the magnet array MB are prepared. Therefore, the concrete process (method) for manufacturing (producing) the magnetic sensors 110 and 150 is explained, hereinafter.

Firstly, a substrate (a quartz glass that will become a substrate 110a1 described later with reference to FIG. 39, a wafer) is prepared on which films M, which will become the GMR elements 111 to 114, 121 to 124, 151 to 154, 161 to 164, are formed. This substrate is formed in a manner similar to the substrate 10a1 shown in FIG. 10. These films M are arranged in such a manner that, when this substrate is cut in the cutting process which will be carried out later, individual magnetic sensors 110 and 150 shown in FIGS. 21 and 22 are obtained.

Figure 38:
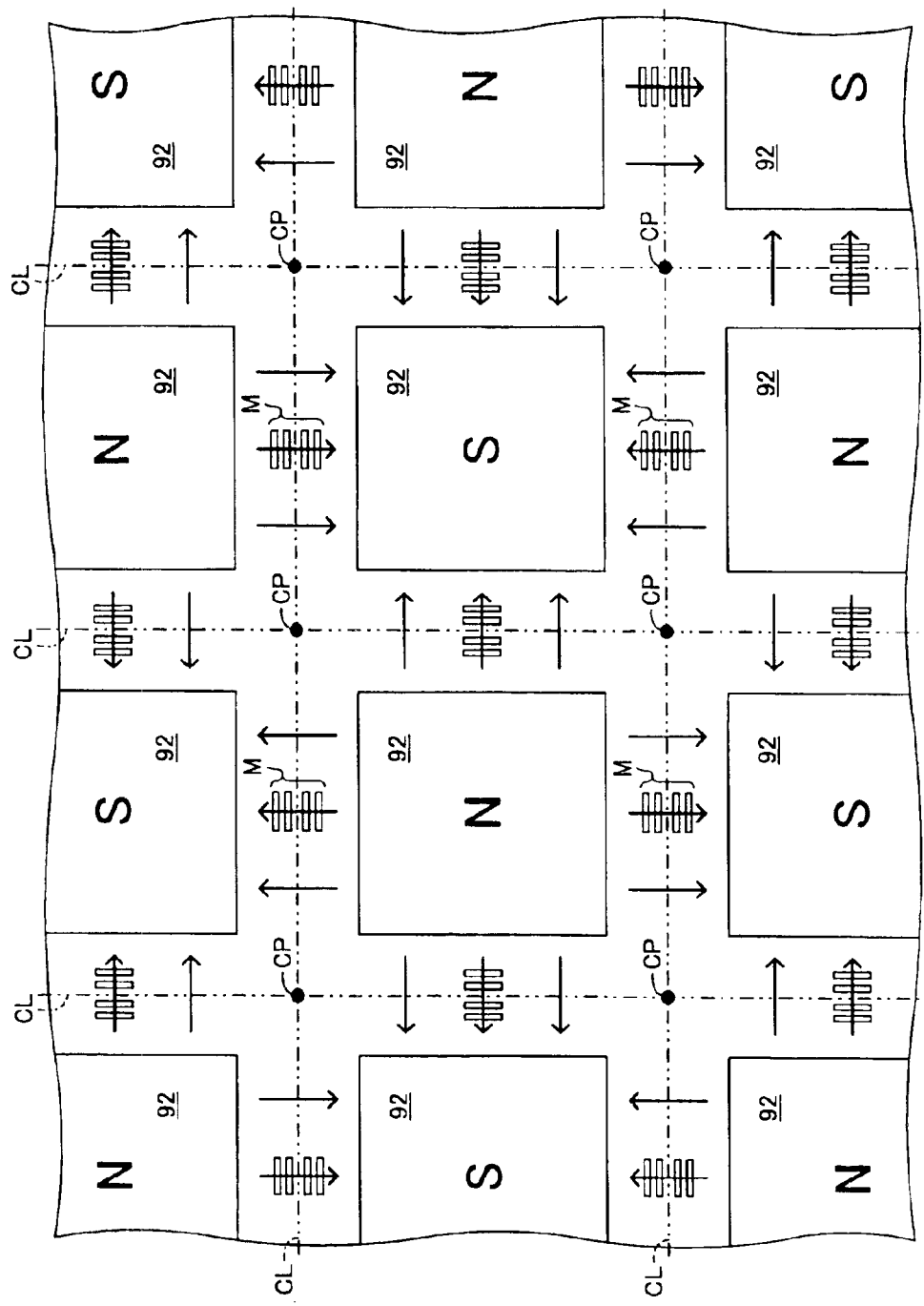
FIG. 38 is a conceptional view showing a method of pinning a direction of magnetization in the pinned layer of each GMR element of the magnetic sensor shown in FIGS. 21 and 22.

Next, the above mentioned substrate on which films M which will become the GMR elements are formed and the magnet array MA (the plate 93) are arranged as shown in FIG. 38, and relative positional relationship between them is fixed. At this time, they are disposed in such a manner that a surface on which the films M which will become the GMR elements are formed is made to come in contact with (be in abutment with) an upper surface of the plate 93 (see. FIG. 14.). Further, the substrate and the magnet array MA are relatively arranged in such a manner that each cross-point CP of the cutting plane line CL of the substrate that becomes each side of the magnetic sensors 110 and 150 is matched with the respective center of gravity of the four adjacent permanent bar magnets 92 . . . 92. As a result, a magnetic field is applied to each film M which will become the GMR element in the direction perpendicular to the longitudinal direction of the narrow zonal portion of each film M in the state wherein the substrate is placed on the upper surface of the magnet array MA, as shown by arrows in FIG. 38.

This second embodiment utilizes this magnetic field for performing a heat treatment to fix the direction of magnetization in the fixed layer P (pinned layer of the fixed layer P). Specifically, the plate 93 and the substrate are fixed to each other by the cramp C (see. FIG. 14) with the state shown in FIG. 38, then, the resultant is heated in a vacuum to 250 to 280° C. and left for about four hours in this state (i.e., the annealing for ordering is performed).

Figure 39:
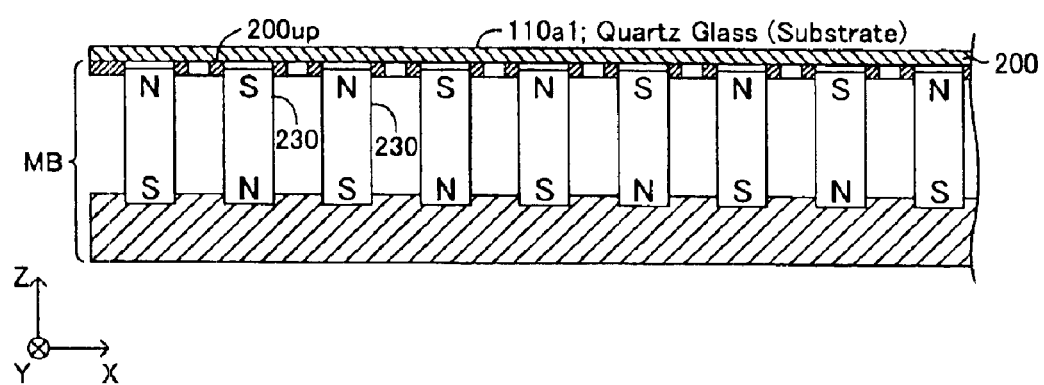
FIG. 39 is a sectional view showing a relative positional relationship between a substrate and the magnet array MB when magnetizing the bias magnet file of each GMR element of the magnetic sensor shown in FIGS. 21 and 22.
Figure 40:
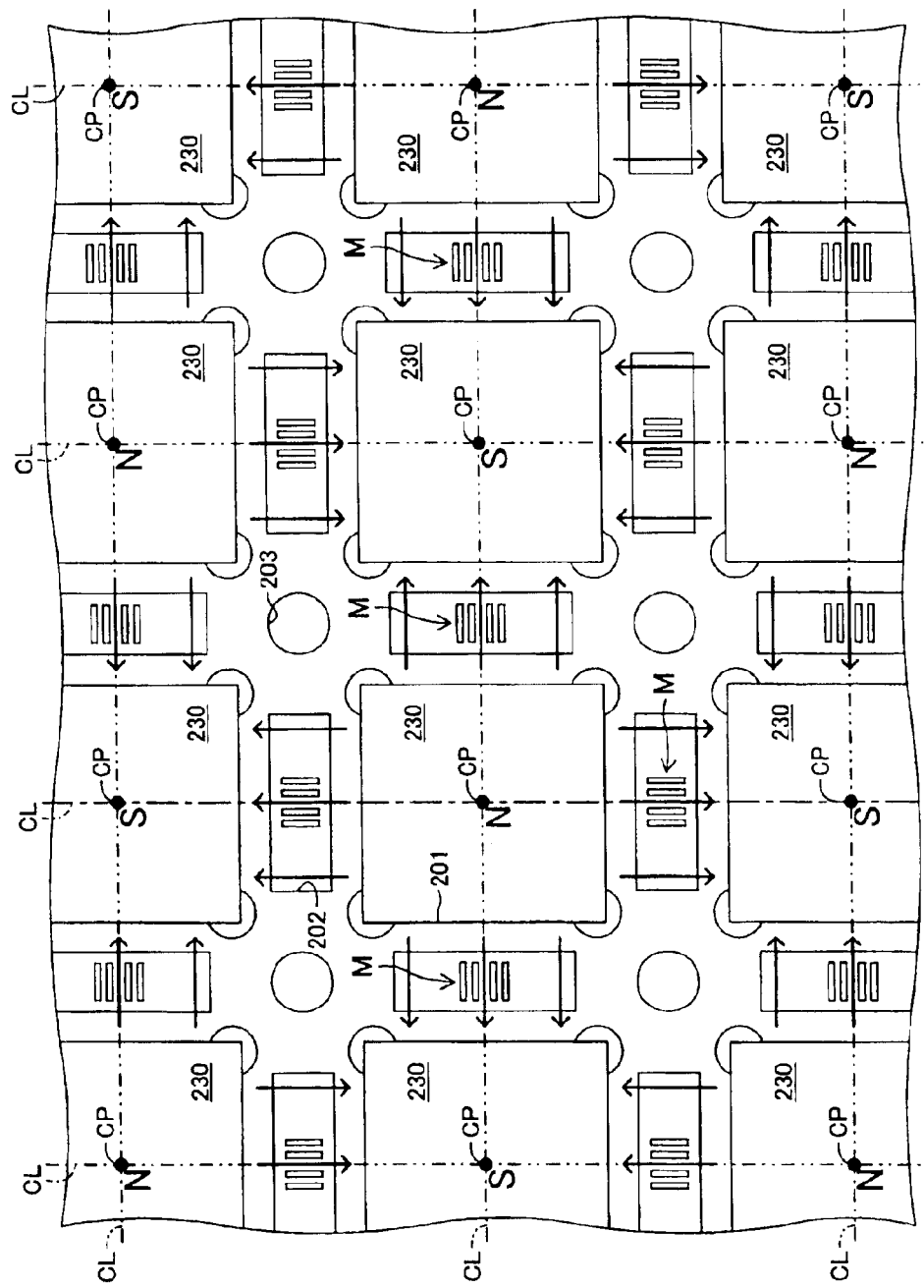
FIG. 40 is a conceptional view showing a method of magnetizing a bias magnet film of each GMR element of the magnetic sensor shown in FIGS. 21 and 22.

Next, as shown in FIG. 39, the substrate 110a1 on which the films M which will become the GMR elements are formed is arranged in such a manner that the plane on which the films M which will become the GMR elements are formed comes in contact with (is in abutment with) the upper surface 200up of the yoke 200 of the magnet array MB. At this time, as shown in FIG. 40 which is a fragmentary enlarged plan view, the substrate and the magnet array MB are relatively arranged in such a manner that each crosspoint CP of the cutting plane line CL of the substrate 110a1 that becomes each side of the magnetic sensors 110 and 150 is matched with the respective center of gravity of the each permanent bar magnet 230 . . . 230. At this time, the films M which will be the GMR elements is disposed inside of the through openings 202 of the yoke 200, in viewed in a plane. Accordingly, as shown by arrows in FIG. 40, a magnetic field is applied to each film M which will become the GMR element in the longitudinal direction of the narrow zonal portion of each film M in the state wherein the substrate 110a1 is placed on the upper surface 200up of the yoke 200.

This second embodiment utilizes this magnetic field for magnetizing the bias magnet films as well as for matching the direction of magnetization in each magnetic domain in the free layer F with the direction in the initial state.

Thereafter, the substrate 110a1 is removed to form a wiring or the like for connecting each film M, and finally, the substrate 110a1 is cut along the broken line shown in FIGS. 38 and 40. As described above, a great number of monolithic (single chip) magnetic sensors 110 shown in FIG. 21 and monolithic (single chip) magnetic sensors 150 shown in FIG. 22 are simultaneously produced.

As explained above, in the second embodiment, the strong magnetic field is provided at local space by utilizing the magnet array MB, and the magnetic field thus provided is used to magnetize the the bias magnet films of the GMR elements. The magnet array MB comprises the yoke having through openings 202 serving as air gaps. Therefore, the magnet array MB can provide a space close to the through openings 202 with a magnetic field whose magnitude is great and which is stably constant. Accordingly, even if the magnetic material having a high coersive force is adopted to the bias magnetic film, the bias magnetic film can be assuredly magnetized. As a result, a high reliable magnetic sensor 110 and 150 can be provided in which the direction of magnetization in the free layer is stably returned to the initial-state direction even after the strong disturbance (e.g., a magnetic field whose magnitude is relatively large) is added to the magnetic sensor.

In addition, the yoke 200 has the openings 203 formed at regions where the magnetic fields are unstable because of crossing (or collision) of magnetic flux lines stemming from the poles. As a result, since the direction of the magnetic flux lines become stable, the magnetic field in the region in the neighborhood of the through opening 202 becomes more stable. Further, the openings 203 are used to adjust the distance between the substrate for the array 210 of the magnet array MB and the yoke 200 (i.e., the height of the yoke 200). Therefore, since it is possible to adjust the height of the yoke easily and desirably, an optimum magnetic field can be provided for a region where the bias magnetic film of the GMR element is disposed to be magnetized.

Moreover, the through hole 201 of the yoke 200 of the magnet array MB has the shape which is not a square shape but which includes the margin portions 201b swelling outwardly from the square at each of corners of the square. Therefore, when forming the through hole 201 by etching, even if the corner of the through hole is not completely etched as designed, the permanent bar magnet 230 can be assuredly inserted into the through hole 201. It should be noted that this type of margin portion may preferably be formed at corners of the concavities 210b.

Figure 20:
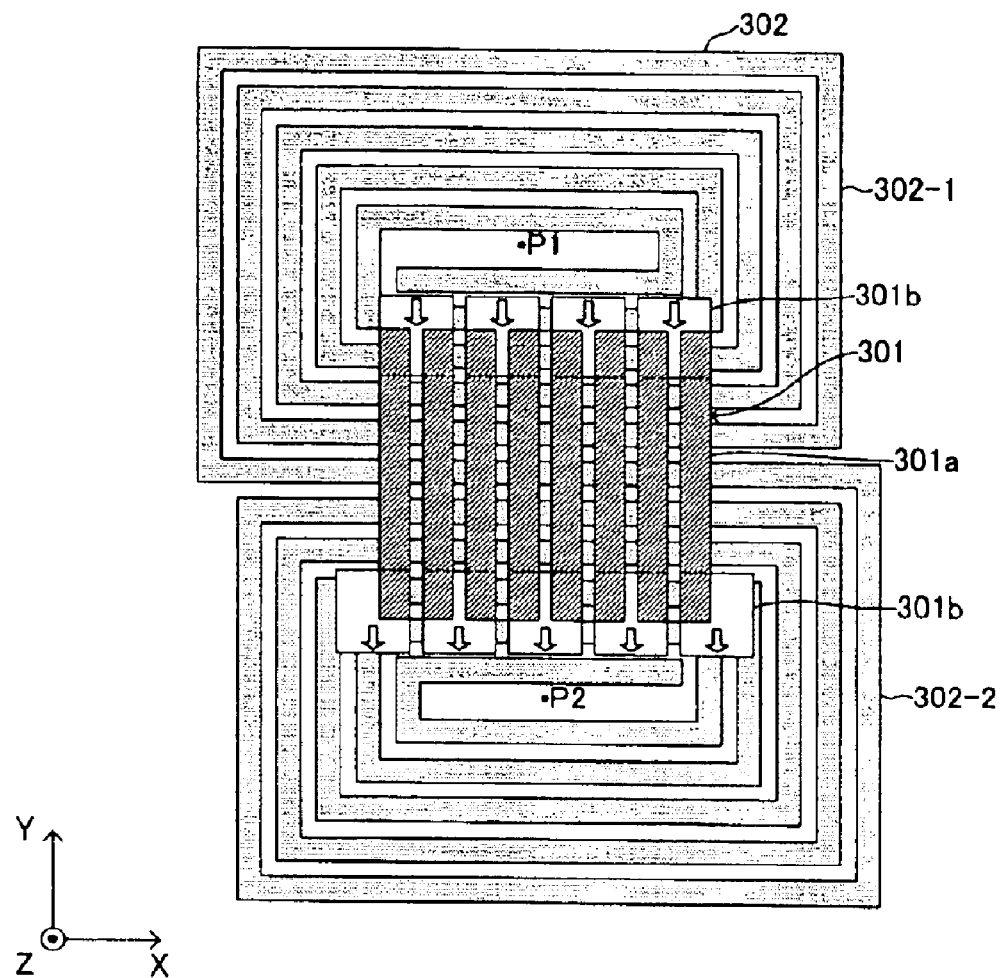
FIG. 20 is a schematic enlarged plan view of a first X-axis GMR element of a magnetic sensor according to another embodiment of the present invention.

The present invention is not limited to the above-mentioned embodiment, but various modifications can be applied within the scope of the present invention. For example, as shown in FIG. 20 representing a first X-axis GMR element 301 taking as a representative example, narrow zonal portions 301a may be separated at the upper portion of the bias magnet films 301b . . . 301b disposed below both ends thereof. Further, an initializing coil 302 may be a double spiral type coil wherein a spiral coil 302-1 having a center point P1 and a spiral coil 302-2 having a center point P2 are connected to each other. In this case, the first X-axis GMR element 301 is arranged between the center point P1 and the center point P2, resulting in that currents parallel to each other flow in the same direction (in a direction perpendicular to the longitudinal direction of the narrow zonal portions 301 a) through each conductor section of the initializing coil 302 passing below the first X-axis GMR element 301, thereby generating the initializing magnetic field. Moreover, the initializing coil may be a multi-layered coil or may be a toroidal coil. Further, a testing coil that generates a testing magnetic field, in the direction perpendicular to the initializing magnetic field generated by the initializing coil, for checking a function of each GMR element may also be disposed in the insulating layer above or below (Z-axis direction) the initializing coil.

What is claimed is:

1. A production process of a magnetic sensor comprising, on a substrate, a pinned layer, a free layer and a bias magnet film being a permanent magnet that applies a bias magnetic field to the free layer to form a magnetoresistive effect element having a resistance value varying according to a relative angle made by a direction of magnetization in the pinned layer and a direction of magnetization in the free layer, comprising:

a step of preparing a magnet array configured such that plural permanent magnets are arranged on a lattice point of a tetragonal lattice and a polarity of a magnet pole of each permanent magnet is different from a polarity of the other adjacent magnet pole spaced by the shortest route;

a step of manufacturing a wafer, including the substrates, on which plural island-like element films are interspersed, each element film including a film that becomes the pinned layer, a film that becomes the free layer and a film that becomes the bias magnet film; and a step of disposing the wafer in the vicinity of the magnet array so as to establish a predetermined relative positional relationship between the wafer and the magnet array, whereby the film that becomes the bias magnet film of the plural element films is magnetized by utilizing a magnetic field formed between one magnet pole of the magnet poles of the magnet array and other magnet pole, of the magnet poles of the magnet array, that is adjacent to the one magnet pole spaced by the shortest route.

2. A production process of a magnetic sensor comprising, on a substrate, a pinned layer, a free layer and a bias magnet film being a permanent magnet that applies a bias magnetic field to the free layer to form a magnetoresistive effect element having a resistance value varying according to a relative angle made by a direction of magnetization in the pinned layer and a direction of magnetization in the free layer, comprising:

a step of preparing a magnet array configured such that plural permanent magnets are arranged on a lattice point of a tetragonal lattice and a polarity of a magnet pole of each permanent magnet is different from a polarity of the other adjacent magnet pole spaced by the shortest route;

a step of manufacturing a wafer, including the substrates, on which plural island-like element films are interspersed, each element film including a film that becomes the pinned layer, a film that becomes the free layer and a film that becomes the bias magnet film; and a step of disposing the wafer in the vicinity of the magnet array so as to establish a predetermined relative positional relationship between the wafer and the magnet array, whereby the film that becomes the bias magnet film of the plural element films is magnetized by utilizing a magnetic field formed between one magnet pole of the magnet poles of the magnet array and other magnet pole, of the magnet poles of the magnet array, that is adjacent to the one magnet pole spaced by the shortest route; wherein the step of manufacturing the wafer includes a step of forming each film, that becomes the free layer, of the plural element films in such a manner as to have a shape with a long axis and a short axis, and in such a manner that at least one of the long axes of the films that become the free layers of the plural element films is perpendicular to the long axis of the other film, that becomes the free layer, of the plural element films and a step of forming the film that becomes the bias magnet film at both ends of each film that becomes the free layer, in the direction of the long axis, and wherein the predetermined relative positional relationship in the step of magnetizing the film that becomes the bias magnet film is a relative positional relationship, between the wafer and the magnet array, that matches the direction of magnetization of the film that becomes the bias magnet film with the direction of the long axis of the film that becomes the free layer having the bias magnet film provided at both ends thereof, by a magnetic field formed by the magnet array.

3. A production process of a magnetic sensor comprising, on a substrate, a pinned layer, a free layer and a bias magnet film being a permanent magnet that applies a bias magnetic field to the free layer to form a magnetoresistive effect element having a resistance value varying according to a relative angle made by a direction of magnetization in the pinned layer and a direction of magnetization in the free layer, comprising:

a step of preparing a magnet array configured such that plural permanent magnets are arranged on a lattice point of a tetragonal lattice and a polarity of a magnet pole of each permanent magnet is different from a polarity of the other adjacent magnet pole spaced by the shortest route;

a step of manufacturing a wafer, including the substrates, on which plural island-like element films are interspersed, each element film including a film that becomes the pinned layer, a film that becomes the free layer and a film that becomes the bias magnet film; and a step of disposing the wafer in the vicinity of the magnet array so as to establish a predetermined relative positional relationship between the wafer and the magnet array, whereby the film that becomes the bias magnet film of the plural element films is magnetized by utilizing a magnetic field formed between one magnet pole of the magnet poles of the magnet array and other magnet pole, of the magnet poles of the magnet array, that is adjacent to the one magnet pole spaced by the shortest route; wherein the step of manufacturing the wafer includes a step of forming each film, that becomes the free layer, of the plural element films in such a manner as to have a shape with a long axis and a short axis, and in such a manner that at least one of the long axes of the films that become the free layers of the plural element films is perpendicular to the long axis of the other film, that becomes the free layer, of the plural element films and a step of forming the film that becomes the bias magnet film at both ends of each film that becomes the free layer, in the direction of the long axis, and wherein the predetermined relative positional relationship in the step of magnetizing the film that becomes the bias magnet film is a relative positional relationship, between the wafer and the magnet array, that matches the direction of magnetization of the film that becomes the bias magnet film with the direction of the long axis of the film that becomes the free layer having the bias magnet film provided at both ends thereof, by a magnetic field formed by the magnet array; further comprising a step of arranging the wafer in the vicinity of the magnet array so as to establish a relative positional relationship, between the wafer and the magnet array, that is different from the predetermined relative positional relationship, whereby the direction of magnetization of the film, that becomes the pinned layer, of the plural element films is pinned by utilizing the magnetic field formed by the magnet array.

* * * * *